US012770822B2

(12) United States Patent
Henstra et al.

(10) Patent No.: US 12,770,822 B2
(45) Date of Patent: Oct. 20, 2026

(54) ABERRATION CORRECTION IN CHARGED PARTICLE SPECTROSCOPY

(71) Applicant: FEI COMPANY, Hillsboro, OR (US)

(72) Inventors: Alexander Henstra, Utrecht (NL); Wouter Verhoeven, Nuenen (NL)

(73) Assignee: FEI Company

( * ) Notice: Subject to any disclaimer, the term of this patent is extended or adjusted under 35 U.S.C. 154(b) by 293 days.

(21) Appl. No.: 18/748,912

(22) Filed: Jun. 20, 2024

(65) Prior Publication Data

US 2025/0391629 A1 Dec. 25, 2025

(51) Int. Cl.
*H01J 37/15* (2006.01)
*H01J 37/14* (2006.01)
*H01J 37/141* (2006.01)
*H01J 37/153* (2006.01)

(52) U.S. Cl.
CPC .......... *H01J 37/153* (2013.01); *H01J 37/141* (2013.01); *H01J 2237/04922* (2013.01); *H01J 2237/1534* (2013.01)

(58) Field of Classification Search
CPC ................... H01J 37/153; H01J 37/141; H01J 2237/04922; H01J 2237/1534
See application file for complete search history.

(56) References Cited

U.S. PATENT DOCUMENTS 5,089,703 A * 2/1992 Schoen ............... H01J 49/4215 250/281
2004/0227099 A1* 11/2004 Matsuya ............... H01J 37/153 250/398
2021/0407784 A1* 12/2021 Chen ..................... H01J 49/421

OTHER PUBLICATIONS

"Momentum Resolved Excitation Transmission Electron Microscope", Corrected Electron Optical Systems, Available online at: https://www.ceos-gmbh.de/en/research/more-tem, Accessed from Internet on Jul. 17, 2024, pp. 1-2.
Krivanek et al., "Progress in Ultrahigh Energy Resolution EELS", Ultramicroscopy, vol. 203, Available online at: https://www.sciencedirect.com/science/article/abs/pii/S0304399118303668?via%3Dihub#preview-section-cited-by, Aug. 2019, pp. 60-67.

* cited by examiner

*Primary Examiner* — Nicole M Ippolito
(74) *Attorney, Agent, or Firm* — Leron Vandsburger

(57) ABSTRACT

A method for correcting aberrations in a charged particle spectrometer includes receiving, by the charged particle spectrometer, a charged particle beam along an axis and applying a first decapole field to the charged particle beam by a first optical correction element of the charged particle spectrometer. At least a portion of the first optical correction element is positioned before a line focus of the charged particle beam in a dispersion plane on the axis and a cross-over location on the axis such that the first decapole field partially attenuates a fourth order aberration associated with the charged particle beam. The method includes increasing a dispersion and applying a second decapole field to the charged particle beam by a second optical correction element of the spectrometer such that the second optical correction element is positioned after the cross-over such that the second decapole field further attenuates the fourth order aberration.

20 Claims, 11 Drawing Sheets

ABERRATION CORRECTION IN CHARGED PARTICLE SPECTROSCOPY

The present disclosure is directed to charged particle microscope system components, systems, and methods. More particularly, the present disclosure describes aberration correction in high resolution charged particle spectroscopy.

BACKGROUND

Charged particle microscopy, such as transmission electron microscopy (TEM) and scanning electron microscopy (SEM), can use an array of detection techniques to obtain information about a sample. SEM and TEM techniques may be used to image various types of samples including surfaces/interiors of cells, structures of protein molecules, organization of molecules in viruses and cytoskeletal filaments, etc. TEMs specifically may use various techniques depending on the type of sample to be imaged. One such technique is called electron energy loss spectroscopy (EELS), where an electron beam emerging from a sample can be dispersed into an energy spectrum to be subsequently imaged. Unlike SEM techniques, which sometimes look at surface topography, TEM devices utilize the electron beam to pass completely through the sample to study interior topographies of the sample. Due to intrinsic laws of nature, electrons within the electron beam scatter after interacting with the sample. As a result, many of the electrons experience energy loss and, consequently, experience imaging plane focal shifts associated with chromatic aberrations which requires adjusting the lensing optics in order to acquire a high-resolution image as well as various degrees of geometric aberrations which may affect image quality by introducing astigmatisms and blurriness. Accordingly, an imaging resolution may be negatively affected by various aberrations, and a solution may be needed to achieve high resolution imaging using various TEM and SEM devices.

BRIEF SUMMARY

In some embodiments, a method for correcting aberrations in a charged particle spectrometer may include receiving, by the charged particle spectrometer, a charged particle beam along an axis and applying a first decapole field to the charged particle beam by a first optical correction element of the charged particle spectrometer. The first optical correction element is positioned before a cross-over on the axis, and the first decapole field partially attenuates a fourth order aberration associated with the charged particle beam. In addition, the method includes applying a second decapole field to the charged particle beam by a second optical correction element of the spectrometer such that the second optical correction element has a position after the cross-over of the charged particle beam exists after the cross-over such that a dispersion of the charged particle beam exists in the dispersion plane at the position of the second optical correction element such that the second decapole field further attenuates the fourth order aberration.

In some embodiments, the method may include receiving the charged particle beam through an entrance aperture positioned prior to the first optical correction element and an aperture diameter of the entrance aperture is in a first range of 0.1 mm to 10 mm. The method further includes the line focus of the charged particle beam comprises at least one of: (i) an xz-line focus along an xz-dispersion plane at a focus location before the cross-over, or (ii) a yz-line focus in the yz-dispersion plane along the axis at a second focus location after the cross-over.

In some embodiments, the method may include measuring the charged particle beam at a detector positioned after the second optical correction element to produce an image with a resolution of the image in a range of 0.01 mV/pixel to 1000 mV/pixel.

In some embodiments, the method may include attenuating at least two fourth order aberration coefficients, such that attenuating the fourth order aberration further by the second optical correction element includes attenuating at least one additional fourth order aberration coefficient and at least two fourth order aberration coefficients. Additionally the at least one additional fourth order aberration coefficient may be different coefficients of the fourth order aberration.

In some embodiments, the method may include wherein each one of the first optical correction element and the second optical correction element comprises one or more corresponding dodecapole elements.

In some embodiments, the method may include wherein the second decapole field is applied by using a first range of ampere-turns and wherein the first range of ampere-turns is 1 to −20 ampere-turns.

In some embodiments, the method may include wherein the at least two fourth order aberration coefficients are $A_{22}$, $A_{40}$ and the at least one additional fourth order aberration coefficient is $A_{04}$.

In some embodiments, the method may include partially attenuating a geometric aberration associated with the charged particle beam, and wherein further attenuating the fourth order aberration by the second optical correction element comprises attenuating the geometric aberration of shape $A_{0n}(x|\delta^n)$, wherein Aon is an aberration coefficient, wherein x is an imaging axis, wherein n is a unique order of aberration, and wherein δ is a dispersion angle associated with the charged particle beam in the dispersion plane.

In some embodiments, the method may include a first multipole element and a second multipole element and applying the first decapole field to the charged particle beam comprises exciting the first multipole element and the second multipole element. The method includes at least partially attenuating up to four orders of geometric aberrations and attenuating one or more orders of chromatic aberration in response to exciting the first multipole element and the second multipole element.

In some embodiments, the method may include the second optical correction element including a third multipole element, and applying the second decapole field to the charged particle beam further includes exciting the third multipole element, and up to four orders of the geometric aberrations are attenuated in response to exciting the third multipole element.

In some embodiments, a non-transitory computer-readable storage medium may include instructions that are executable by one or more processors of a charged particle spectrometer for causing operations that may include applying a first decapole field to a charged particle beam by a first optical correction element of the charged particle spectrometer such that the charged particle beam is received by the charged particle spectrometer along an axis, and at least a portion of the first optical correction element is positioned before a line focus of the charged particle beam in a dispersion plane on the axis and a cross-over on the axis, and wherein the first decapole field partially attenuates a fourth order aberration associated with the charged particle beam. The operations further include applying a second decapole field to the charged particle beam by a second optical correction element of the charged particle spectrometer, wherein the second optical correction element is positioned after the cross-over, wherein a dispersion plane of the charged particle beam exists after the cross-over such that a dispersion of the charged particle beam exists in the dispersion plane at the position of the second optical correction element, wherein the second decapole field further attenuates the fourth order aberration.

In some embodiments, the operations may include applying one or both of a hexapole field and an octupole field to the charged particle beam.

In some embodiments, the operations may include increasing a first dispersion along a yz-dispersion plane of the charged particle beam after the cross-over relative to the axis while maintaining a second dispersion along an xz-dispersion plane of the charged particle beam at a constant size relative to the axis.

In some embodiments, the charged particle spectrometer may be configured to use parallel momentum resolved electron energy loss modes, and attenuation of the fourth order aberration causes a reduction to a distortion of an image along the axis by an order of magnitude.

In some embodiments, a charged particle spectrometer may include a first optical correction element, a second optical correction element, an entrance aperture configured to receive a charged particle beam, and a controller configured to cause the first optical correction element to apply a first decapole field to the charged particle beam. The spectrometer further includes positioning the first optical correction element before a cross-over on such that the first decapole field partially attenuates a fourth order aberration associated with the charged particle beam. The controller may cause the second optical correction element to apply a second decapole field to the charged particle beam such that the second optical correction element has a position after the cross-over such that a dispersion of the charged particle beam exists in a dispersion plane at the position of the second optical correction element such that the second decapole field further attenuates the fourth order aberration.

In some embodiments, the charged particle spectrometer may include an entrance aperture that has an aperture diameter such that aperture diameters in a range of 2 mm to 5 mm may produce equal energy resolutions.

In some embodiments, the charged particle spectrometer may include an entrance aperture that has an aperture diameter such that aperture diameters in a range of 2 mm to 5 mm may produce equal a signal-to-noise ratios.

In some embodiments, the charged particle spectrometer may include a slit and/or knife edge such that the first optical correction element is positioned before the slit, and wherein the second optical correction element may be positioned after the slit.

In some embodiments, the charged particle spectrometer may cause the first optical correction element to apply a third decapole field to the charged particle beam such that applying the third decapole field to the charged particle beam at least partially modifies a y-field dimension of the charged particle beam to have at least two foci prior to the cross-over.

In some embodiments, the charged particle spectrometer may attenuate two fourth order coefficients prior to the cross-over on the axis and one fourth order coefficient after the cross-over on the axis.

BRIEF DESCRIPTION OF THE DRAWINGS

The foregoing aspects and many of the attendant advantages of the present disclosure will become more readily appreciated as the same become better understood by reference to the following detailed description, when taken in conjunction with the accompanying drawings.

Figure 1:
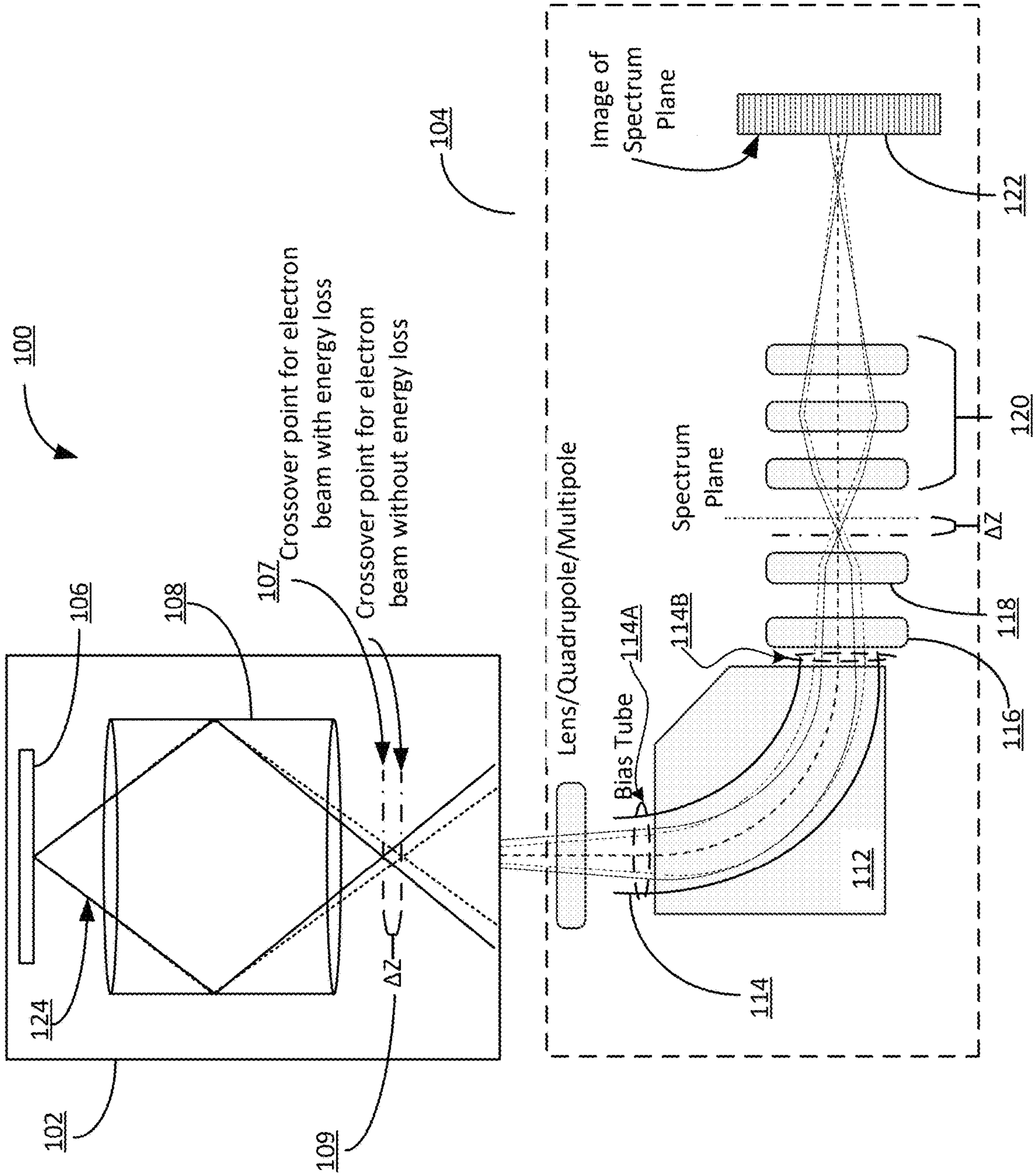
FIG. 1 (Prior Art)
FIG. 1 is an example illustration of a portion of a microscope system as currently known in the art.

In the drawings, like reference numerals refer to like parts throughout the various views unless otherwise specified. Not all instances of an element are necessarily labeled to reduce clutter in the drawings where appropriate. The drawings are not necessarily to scale, emphasis instead being placed upon illustrating the principles being described.

DETAILED DESCRIPTION

Embodiments of the present invention are described below in the context of a charged particle microscope system. In an example, the charged particle microscope system is configured for acquiring energy spectra of a sample. The charged particle microscope can include a charged particle spectrometer configured to correct spectroscopy aberrations. The charged particle spectrometer (or simply "spectrometer" in the interest of brevity) can include multiple optical correction elements. Excitation (e.g., electric and/or magnetic) of at least some or all of the optical correction elements can be controlled to attenuate fourth order aberrations. These and other features of the present disclosure are further described herein below. It should be understood that the methods described herein are generally applicable to a wide range of different methods and apparatus, including EELS, EFTEM, TEM, SEM, both scanning-probe systems and parallel illumination systems, and are not limited to any particular apparatus type, beam type, object type, length scale, or scanning trajectory.

As used in this application and in the claims, the singular forms "a", "an", and "the" include the plural forms unless the context clearly dictates otherwise. Additionally, the term "includes" means "comprises". Further, the term "coupled" does not exclude the presence of intermediate elements between the coupled items.

The systems, apparatuses, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatuses are not limited to any specific aspect or feature or combinations thereof, nor do the disclosed systems, methods, and apparatuses require that any one or more specific advantages be present or problems be solved. Any theories of operation are to facilitate explanation, but the disclosed systems, methods, and apparatuses are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatuses can be used in conjunction with other systems, methods, and apparatuses. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one or ordinary skill in the art.

In some examples, values, procedures, or apparatuses are referred to as "lowest", "best", "minimum", or the like. It will be appreciated that such descriptions are intended to indicate that a selection among many used functional alternatives can be made, and such selections need not be better, smaller, or otherwise preferable to other selections.

Some techniques, including electron energy loss spectroscopy (EELS) and energy filtered transmission electron microscopy (EFTEM) may incorporated into a transmission electron microscope (TEM) for analysis of compositional or other chemical properties of a sample. Embodiments herein may be applied to EELS or EFTEM spectroscopy. EELS is conventionally performed using an energy spectrometer mounted at an end of a column of the TEM. Such energy spectrometers may also be referred to as a post column filters (PCF). In some examples, the spectrometer may be integrated in the imaging system of the TEM. Such alternative spectrometers may be referred to as in-column filters (ICF). The present disclosed method may apply to PCFs as well as to ICFs. Energy spectrometers can be used to obtain energy spectra of transmission data. For example, a sample (e.g., a substrate) in a TEM is interrogated with an electron beam of a desired energy. Some of the electrons exiting from the sample may have reduced energy thus characterizing various properties (e.g., nanostructures, topography, or similar) of the sample. The energy spectrometer may then be used to view an energy distribution of the electron beam after passing through the sample to look for peaks at various energy levels that provide data, e.g., various properties, of the sample material. Given some current TEM and detector technologies, the peaks can be highly resolved to millielectron volt levels, for example. However, imperfections in transmission electron microscopes may blur data such that desired resolution of the sample properties are reduced or lost. The loss of resolution may be due to a variety of factors, such as mechanical (parasitic) and electrical instabilities (vibrations), energy spread of the incoming beam due to the inherent energy spread of the electron source, finite resolution of the detector due to the finite size of its pixels, and chromatic defocusing of the electron beam as it propagates through portions (e.g., lenses, multipoles, or similar) of the transmission electron microscope and the energy spectrometer. The level of such defocus is electron energy dependent; but also changes depending on microscope settings, such as altering (increasing/decreasing) magnification settings of components of the microscope, energy spectrometer, or both, as the chromatic aberration of each lens, multipole (or similar) varies with its excitation. As higher resolution energy spectra are desired for wider aperture diameters, geometric and chromatic aberrations may become a larger problem possibly necessitating various adjustments of optical correction elements of the spectrometer.

Entrance apertures for spectrometers have conventionally been at least partially dependent on a transmissivity for certain specified energy resolutions. For example, for low transmissivity, an awkwardly small aperture size must be used which may limit the number of desired electrons intended to be captured. Resolution of imaging can be improved by increasing the amount of charged particles that reach the spectrometer through an entrance aperture, but at a cost of more instruments and added complexity to shape undesirable beam properties (e.g., astigmatisms). The entrance aperture of spectrometers conventionally needs to be relatively small (e.g., 2.5 mm or less) to achieve a resolution on the order of 5 mV/pixel. However, smaller apertures may reduce the amount of charged particles that enter the spectrometer thus limiting useful resolutions of obtainable images. In EFTEM examples, the cross-over may function as a slit plane (e.g., a plane where a knife edge slit or similar is used in calibration procedures for various types of aberrations affecting a quality of image). Conventional spectroscopy methods may include correcting at least some geometric and chromatic aberrations prior to the charged particle beam reaching the cross-over (e.g., a focus in at least one of the y/x dimension relative to z) since having the focus beyond the cross-over may result in relatively small post-cross-over beam waists. With relatively small post-slit plane beam waists, and dependence on an entrance aperture size, increasingly strong and sometimes impractical electromagnetic fields may have to be applied by several electromagnetic pole elements (e.g., twelve pole elements) in a post-cross-over location would be required to affect the charged particle beam to achieve desired resolutions free of aberrations. Having more high-power electromagnetic pole elements can be costly, space consuming, and ineffective at correcting higher order aberrations that are difficult to correct with relatively small post-slit beam waists.

Now turning to the present invention, in some examples, obtaining a high energy resolution (e.g. ten mV) with a large entrance aperture (e.g., five mm) may be achieved by creating at least one line focus in at least one dimension, which may exist prior to a cross-over (sometimes referred to as a slit plane), and correcting geometric aberrations in both pre-cross-over and a post-cross-over positions. In some examples, two foci may be created prior to the cross-over such that a y-dimension of the charged particle beam after the cross-over is enlarged. The larger entrance diameter may ensure that a proportionately large number of charged particles (e.g., electrons) enter the spectrometer. At least two multipole elements may be positioned pre-cross-over such that geometric aberrations are attenuated up to order three (e.g., reducing the aberration coefficients to substantially zero), a chromatic aberration is corrected, and at least two coefficients of fourth order aberrations are attenuated leaving at least one coefficient of the fourth order aberration to be corrected post-cross-over. By shaping the beam profile in at least one dimension (e.g., y dimension) such that the beam profile exhibits at least two line focus locations prior to the cross-over, a large dispersion in a y-dimension can be created in the dimension for case of shaping and correcting higher order aberrations. For example, by having this pre-slit plane (pre-cross over) ray configuration, the beam may be set up to be able to simultaneously magnify the dispersive plane and efficiently correct aberrations of shape $A_{0n}\langle x|\delta^n\rangle$, where n is the order of aberration that is unique, and δ representing a dispersion angle (e.g., zero degrees to ninety degrees relative to a transmission axis) in a particular plane (e.g., along x, for n=4, $A_{04}\langle x|\delta^4\rangle$). In addition, this may result in at least one additional line focus for the chosen dimension in a dispersion plane in the post-cross-over that is relatively large, a modestly small electromagnetic field (applied by at least a third multipole element) is needed to be applied post-cross-over to partially or fully attenuate the fourth order aberration. By splitting the attenuation of the geometric aberration into pre-cross-over corrections and post-cross-over corrections, an entrance aperture can be increased without compromising energy resolution and/or signal-to-noise ratios while increasing a maximum captured scattering angle by a factor of at least 2.5 for a given spot size at a sample compared to conventional techniques. In addition, when applied to plasmon and phonon spectroscopy techniques using parallel momentum resolved EELS (and q-EELS), fourth order corrections reduce distortions (blur, coma, etc.) in dispersive planes by an order of magnitude which facilitates using larger entrance diameters (increasing momentum range, e.g. q-range).

FIG. 1 is an example illustration of a portion of a microscope system 100 as currently known in the art illustrating chromatic aberrations in a dual-EELS mode. The microscope system 100 includes a portion of a transmission electron microscope 102 and an energy spectrometer 104. The microscope system 100 may be used to obtain energy spectra of a sample 106 but may suffer from defocusing of an electron beam 124 on detector 122 due to operating parameters of TEM 102 and energy spectrometer 104, such as magnification setting adjustments.

To illustrate, as electron beam 124 emerges from sample 106, the electron beam 124 takes a trajectory along an optical axis of the microscope 102. This trajectory can be dependent upon energy of electrons in the electron beam 124 and further can be dependent upon operating parameters of the microscope 102. The operating parameters can include operating parameters of an imaging system 108, for example, such as an adjustment of a magnification setting of the microscope 102 for magnification from the sample 106 towards a cross-over point 107 at an end of the microscope 102. Freedom of variation of this magnification is desirable for the user of the microscope system 100, because this magnification can determine how much a cone of electron beam 124 exiting the sample 106 is compressed towards the energy spectrometer 104. More compression can result in a larger part of the cone of the electron beam 124 being accepted by the spectrometer's entrance aperture. Operating parameters can determine excitation settings of optical components, such as lenses, multipole, and quadruple elements of the energy spectrometer 104. Operating parameters can change depending on energy of a primary electron beam, e.g., an energy of an electron beam used to interrogate the sample 106. However, due to sample-electron interaction, an electron beam emerging from the sample 106 may include some energy loss. The energy loss can be desirable, however, since measuring the loss at a range of energies by the energy spectrometer 104 can be beneficial for topological measurements. Yet, the energy loss can also affect crossover locations, e.g., focal points, of the electron beam 124 in the microscope 102 and the energy spectrometer 104. This change in crossover can result in a defocus of an electron beam spectrum on the detector 122.

For example, an electron beam propagating through microscope 102 without any energy loss may have a cross-over location as indicated. However, an electron beam having some energy loss will have a different crossover location, with an offset AZ as indicated, which can propagate through the microscope 102 and the energy spectrometer 104.

The energy spectrometer 104 can include a lens 110 and a dispersive element 112. The dispersive element 112 can include a bias tube 114, lenses (e.g., lenses 116 and 118), a plurality of optical components (e.g., additional lenses, quadrupoles, multipoles, etc.) 120 and the detector 122. The dispersive element 112 can be energized to disperse or 'fan out' the electron beam 124 in a band of different energies that interact. The plurality of optical components 120 can focus and magnify the band on the detector 122. Typically, this band of different energies can be smaller than (e.g., may not cover) a complete range of an EELS spectrum which an operator may be interested in and may want to record. Therefore, the bias tube 113 can be electrically biased to add various amounts (e.g., up to two keV) of energy to the electron beam 124. The added energies can be used to shift the band recorded by the detector 122 (such shift of the energy band can also be accomplished by adjusting an excitation of the dispersive element 112 or by adjusting an operating potential of the electron microscope, such methods, however, can have a drawback of having relatively long settling times and/or of suffering from magnetic hysteresis). Due to an electrostatic nature, a liner tube can establish shifts from one energy band to another energy band in fractions of a millisecond, thus allowing near simultaneous recording of multiple energy bands (e.g., as described in U.S. Pat. No. 10,832,901 B2, incorporated herein by reference). The detector 122 may be arranged at a conjugate of a spectrum plane of the energy spectrometer 104 so that the electron beam 124 is focused on the detector 122.

The energy spectrometer 104 includes optical components, like multipoles, that may be configured to control (e.g., shape) the electron beam 124. The operations of these optical components (e.g., electrical currents that excite one or more of the multipoles magnetically) can be controlled to correct defocus based on the offset ΔZ. Various parameters such as magnification and constants of chromatic aberration may be determined for images detected at detector 122. Using these parameters, the operations of the optical components may be adjusted to correct defocus based on the offset ΔZ. Additionally, valid configurations of parameters may be tabulated for future use where certain configurations are commonly used or where specific configurations may need to be retrieved.

Figure 2:
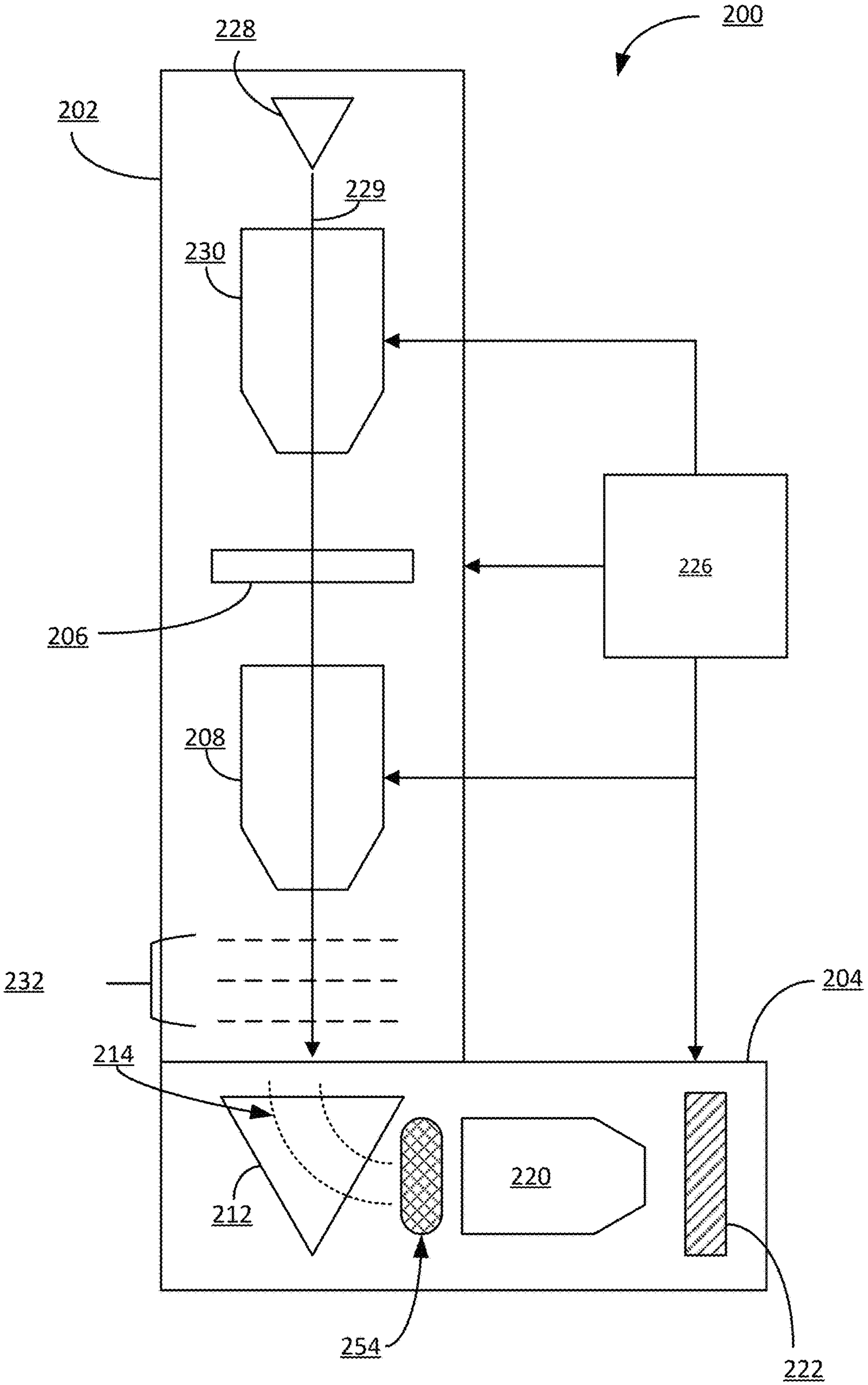
FIG. 2 is a schematic diagram of a charged particle microscope system, according to some embodiments.

FIG. 2 is a schematic diagram of an electron microscope system (EMS) 200, according to some embodiments. EMS 200 may include a TEM 202 in some examples and can include an energy spectrometer 204. The energy spectrometer 204 may be used to obtain EEL spectra, for example. The EMS 200 may include an optical component to reduce or negate any defocusing problems that occur during acquisition of spectra. In some examples, the optical component can be biased to a level based on operating parameters of the EMS 200 and/or energy spectrometer 204 so that the refocusing is dynamic.

TEM 202 can include a source 228, an illumination system 230, a projection system 208, and various detectors 232, all of which can be controlled by controller 226. The source 228 may be an electron source, such as a Schottky source or a (cold) field emission gun (CFEG) and can provide a beam of electrons that propagate along an optical axis of TEM 202 to interact with a sample 206. The illumination system 230 can include a plurality of electronic optic components to condition an electron beam for delivery to the sample 206. Conditioning the electron beam may include collimation, astigmatism correction, and focusing the electron beam at a sample plane. The projection system 208 may include a variety of electrostatic/magnetic lenses, deflectors, correctors (e.g., stigmators), etc., that can be used to focus the electron beam emerging from the sample 206 onto one of the various detectors 232. The projection system 208 may be configured to focus an image of the sample 206 with a certain (adjustable) magnification at the detectors 232; this is commonly referred to as the "imaging mode" of the projection system. Alternatively, the projection system 208 may be configured to focus an image of the angular distribution of emerging electrons (or "diffraction pattern") with a certain (adjustable) magnification at the detectors 232. Such diffraction pattern is formed in the back-focal plane of the first magnifying lens (the "objective lens", not shown in FIG. 2). This alternative mode of the projection system is commonly called the "diffraction mode" and the magnification in this alternative mode is commonly referred to as the "camera length". However, for the sake of simplicity, where the present disclosure writes "images" or "focuses" or the like, this refers both to the "imaging mode" and to the "diffraction mode" of the imaging system. Similarly, where the present disclosure writes "magnification setting" or the like, this refers both to the "magnification setting" and "camera length setting" of the imaging system.

In some examples, the projection system 208 focuses and conditions the electron beam for delivery to the energy spectrometer 204. The various detectors 232 may individually be moved in and out of an optical path to provide different detection schemes for the TEM 202. The various detectors 232 may include an imaging screen, a TEM camera, and a STEM camera.

The energy spectrometer 204 can include dispersive element 212 (with bias tube 214), optical component 234, a plurality of optics 220, and detector 222. Many of the components of the energy spectrometer 204 were discussed with respect to FIG. 1 and will not be revisited for sake of brevity. Other components of the energy spectrometer 104 described in FIG. 1 that are not specifically shown in energy spectrometer 204 can be included but are left out of FIG. 2. An additional component, namely optical component 234, is included in energy spectrometer 204 to correct a gradient of focus of the electron energy loss spectrum across the detector as discussed. The optical component 234 can be a single element such as a magnetic hexapole. Alternatively, optical component 234 can comprise multiple multipole elements (quadrupoles, hexapoles, octupoles, and the like) which can be electric or magnetic in the nature of their operation. Also, apart from the refocusing of the spectrum, the optical component 234 may perform multiple alternative functions simultaneously or not simultaneously, such as correcting image distortions or correcting spectrum distortions. In FIG. 2, optical component 234 is shown downstream from dispersive element 212, but this is not the only location to arrange the optical component 234. In general, some elements of optical component 234 can be arranged upstream from the dispersive element 212 (but downstream from the sample 206), and some elements of the optical component 234 can be arranged downstream of the dispersive element 212 within or after the plurality of optics 220.

Controller 226 may include one or more processing cores and memory storing executable code. In addition, controller 226 may provide operating voltages to some components of the EMS 200 or be coupled to voltage supplies (not shown) that can provide operating voltages in response to control signals provided by the controller 226. For example, the controller 226 may provide control and/or voltages to illumination system 230, projection system 208, or optical component 234. Further, the controller 226 may control operation of detector 222 and/or receive data from detector 222. In general, the controller 226 can set the operating parameters of the EMS 200 and can adjust electrical bias of optical component 234 to dynamically focus the electron beam onto detector 222 in response to changes in operating conditions of the EMS 200, such as magnification.

Optical component 234 may be formed from a multipole element containing two or more electrically conductive elements. In some examples, optical component 234 is formed from two opposing conductive elements, similar to a deflector- or shutter-type arrangement, housed in a conductive body. In other examples, the optical component 234 is formed from a quadrupole or higher order multipole element. The excitation of optical component 234 can be of electric or magnetic nature or a combination of these, or more generally, can be of an electromagnetic nature. Regardless of the physical example, the optical component 234 may be excited to a level based on operating parameters of TEM 202 and/or energy spectrometer 204.

In operation, an electron beam generated by source 228 at a primary energy can be projected toward sample 206, where the electron beam interacts with the sample 206. The interaction may result in some of the electrons losing energy by an amount associated with various material characteristics of the sample 206. The electron beam emerging from the sample 206 may then include electrons of different energies across a range of energies. The emerging electron beam may then propagate at different trajectories than the electrons of the primary energy, which can affect focal points, e.g., crossover locations, along a rest of the optical path including the energy spectrometer 204 and the TEM 202. In some examples, operations of any component that may adjust (steer) the electron beam may subsequently result in defocusing in the spectrum plane or may result in a gradient of focus across the spectrum plane. In this example, to refocus the electron beam, the optical component 234 can be excited based on current operating parameters. In various examples, exciting the optical component 234 can align cross-over locations with the spectrum plane, and thus the detector 222.

Figure 3:
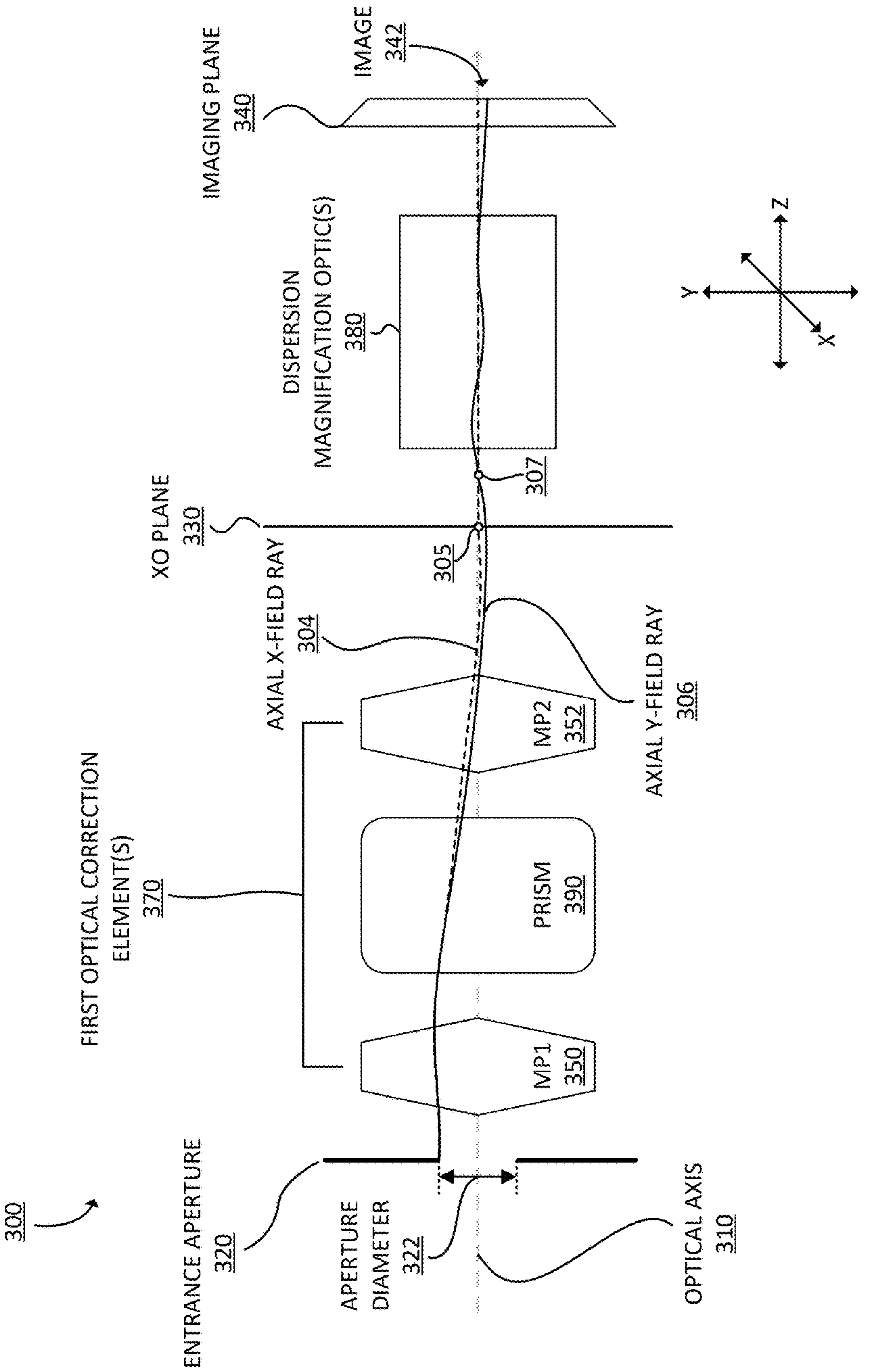
FIG. 3 is a schematic diagram depicting an example of geometric and chromatic aberration corrections in a spectrometer, according to some embodiments.

FIG. 3 is a schematic diagram depicting an example of geometric and chromatic aberration correction in a spectrometer 300, according to some embodiments. The spectrometer 300 may incorporate some or all components of the spectrometer 204 in FIG. 2. By way of an example, a charged particle beam (e.g., electrons) enters an optical system (e.g., first optical correction element(s) 370) at an entrance aperture 320 along optical axis 310 (corresponding to a optical axis of propagation of a charged particle beam depicted traveling left to right in FIG. 3 generally along a "Z" axis). For example, prism 390 is before MP2 352, whereas MP2 352 is after prism 390 as depicted in FIG. 3.

In some examples, the entrance aperture 320 may have an aperture diameter 322 (e.g., 0.1 mm to 10 mm) which controls a beam profile (e.g., a two dimensional particle flux across an arbitrary plane perpendicular to the optical axis 310) that enters the first optical correction element(s) 370. For example, for an aperture diameter 322 of 5 mm may provide a larger beam profile (more flux) to the first optical correction element(s) 370 than an aperture diameter 322 of 1.75 mm. In some examples, the aperture diameter 322 may be adjusted automatically or dynamically by a user of the spectrometer 300 depending on a desired beam profile. In general, it should be understood that the terms "before" and "after" describe positions relative to the optical axis 310 and various components along. In addition, X-Y-Z cartesian coordinates are used to identify positions, orientations, and configurations, and generally in this disclosure, the Y coordinate is vertical (up and down along FIG. 3), the Z coordinate is horizontal (left to right along FIG. 3), and the X coordinate is out of the page and into the page as depicted in FIG. 3. For example, x-field ray 304 is depicted as traversing along the z-axis with a vertical measure in FIG. 3, however, the vertical measure represents an out of page distance relative to the z-axis (if above the z-axis) and an in page distance relative to the z-axis (if below the z-axis). Additionally, each field ray may only represent a portion of the total field in the particular dimension. While the cartesian coordinates were chosen for simplicity, it should be appreciated that the coordinate conventions may be arbitrary swapped and should not be considered limiting.

In some examples, the charged particle beam may enter a series of charged particle optics, such as first optical correction element(s) 370, to undergo various modifications (e.g., reducing aberration coefficients) to the charged particle beam profile. The charged particle beam profile of the charged particle beam may include an x-axis component (e.g., a point on x-field ray 304) and a y-axis component (e.g., a point on y-field ray 306), both perpendicular to the optical axis 310 (e.g., z-axis), and mutually perpendicular to one another, similar to how electromagnetic waves propagate. Upon entering a first multipole element (MP1) 350 of the first optical correction element(s) 370, the charged particle beam profile may be adjusted in one or more dimensions (e.g., x-dimension, y-dimension, etc.) to reduce aberrations such as geometric aberrations or chromatic aberrations. MP1 350 may be an electromagnetic beam shaping device that includes one or more physical electromagnetic poles. In a non-limiting example, MP1 350 may be a dodecapole element, or any other suitable multipole element (e.g., twelve-pole, sixteen-pole, etc.) that includes twelve distinct magnetic, electromagnetic, and/or electrostatic poles, each capable of being polarized at a positive or negative charge depending on a desired field to apply to the charged particle beam. The dodecapole element may be capable of applying any number of suitable field modifications by applying a linear superposition of various multipole fields to create decapole fields, dipole fields, quadrupole fields, hexapole fields, etc., or any suitable number of shaping fields of arbitrary orientation around the optical axis 310. In some examples, MP1 350 may function to correct, at least in part, a geometric aberration associated with the charged particle beam. While MP1 350 is depicted as a single multipole element, it should not be considered limiting, and any suitable number of multipole elements may be placed serially between the entrance aperture 320 and a prism 390 for desired beam shaping.

In some examples, the prism 390 (e.g., a ninety-degree beam transfer prism) functions to provide beam dispersions, e.g., spread x-dimension field ray (x-field ray 304) compared to y-field ray 306, to enable various degrees of aberration correction (degrees of freedom) by various multipole elements. For example, the prism 390 may spread x-field ray 304 compared to y-field ray 306 along the optical axis 310 to enable easier aberration correction for each dimension. In various examples, the prism 390 may apply a suitable field strength to the charged particle beam to attenuate charged particles that are outside of a predefined energy range while permitting charged particles within the predefined energy range to pass and be dispersed. While the prism 390 is depicted as a single prism element, it should not be considered limiting, and any suitable number of prisms may be placed serially between MP1 350 and a second multipole element (MP2) 352 to provide a desired beam dispersion, shape, geometry, charged particle attenuation, or combinations thereof. In addition, while the first optical correction element(s) 370 are depicted as MP1-Prism-MP2, any suitable configuration of first optical correction element(s) 370, including additional multipole elements and prisms may be used to arrive at a desired beam profile (e.g., MP1-MP2-MP3-PRISM-MP4, etc.).

In some examples, MP2 352 may function similar to MP1 350. By way of example, MP1 350 may function to partially correct a geometric aberration of one or both of the x/y-field rays 304/306. After the charged particle beam passes through prism 390 to undergo beam dispersion (essentially "fanning" out the beam), MP2 352 may function to further correct the geometric aberration that MP1 350 partially corrected. By way of example, MP1 350 and MP2 352 may function together to correct more than one type of aberration. In this example, when MP1 350 receives the charged particle beam, MP1 350 may perform partial geometric aberration correction (e.g., correcting one or more fourth order coefficients). MP2 352 may receive the partially corrected charged particle beam from the prism 390 and perform an additional geometric aberration correction (e.g., correcting two or more fourth order coefficients) as well as a chromatic aberration correction (e.g., adjust a focal plane of the charged particle spectrum). In a non-limiting example, MP1 352 may be a dodecapole element that includes twelve distinct magnetic, electromagnetic, and/or electrostatic poles, each capable of being polarized at a positive or negative charge depending on a desired field to apply to the charged particle beam. The dodecapole element may be capable of applying any number of suitable field modifications by applying a linear superposition of various multipole fields to create decapole fields, dipole fields, quadrupole fields, hexapole fields, etc., or any suitable number of shaping fields of arbitrary orientation around an optical axis. In some examples, MP1 352 may function to correct, at least in part, a geometric aberration associated with the charged particle beam. While MP1 352 is depicted as a single multipole element, it should not be considered limiting, and any suitable number of multipole elements may be placed serially between the prism 390 and a cross-over 330 (also referred to as XO plane 330) for desired beam shaping.

In various examples, the XO plane 330 may represent a plane where the x-field ray 304 and the y-field ray 306 approximately "focus" along the optical axis 310 (e.g., where the two field rays are substantially close to one another along the same z-coordinate). In this example, the x-field ray 304 may have a cross-over point 305 in the XO plane 330 where the x-field ray 304 distance from the z axis is approximately zero millimeters "mm". At the cross-over point 305, the y-field ray 306 may have a non-zero distance to the z-axis thus forming a yz-line focus (e.g., no field is present in the x-direction and thus only a field exists along a y-dimension plane). In addition, the y-field ray 306 may have a post-XO plane cross-over point 307 after the XO plane 330. At this post-XO plane cross over point 307, the y-field ray 306 distance from the z-axis is approximately zero mm with the x-field ray may be substantially zero mm as well forming a focus along the z-axis. The XO plane 330 may dynamically shift left and right along the optical axis 310 depending, at least in part, on the aperture diameter 322, energy of the charged particle beam, dispersion of the prism 390, as well as the contributions of MP1 350 and MP2 352. By way of a non-limiting example, when the spectrometer 300 is used in EFTEM techniques, the XO plane 330 may include a slit and/or knife edge that may be dynamically placed in and out of the path of the charged particle beam in order to calibrate the spectrometer 300 by passing some charged particles while limiting others based on a predefined threshold (e.g., passing charged particle energies less than 200 eV and blocking electron energies greater than two hundred eV). In some examples, the XO plane 330 may shift to be substantially adjacent to the final optic in the first optical correction element(s) 370 or the XO plane 330 may shift to be substantially adjacent to dispersion magnification optics 380 (magnification optics 380), depending on aforementioned configurations. While this non-limiting example presented an EFTEM technique utilizing a slit or knife-edge, it should be appreciated that embodiments herein include slit-less XO planes 330 where no slit is inserted into the spectrometer 300 (e.g., such as for use in EELS).

In some examples, the magnification optics 380 may receive the charged particle beam from the first optical correction element(s) 370. The magnification optics 380 may function to adjust an energy resolution of the charged particle beam based on the energy dispersion of the spectrum. The magnification optics 380 may condition (e.g., correct dispersion and provide magnification) the charged particle beam for detection by a detector (not depicted) in an imaging plane. The detector may convert the charged particle beam pattern into an image 342 (e.g., an image representing at least a portion of a sample interrogated by the charged particle beam prior to the entrance aperture).

Figure 4:
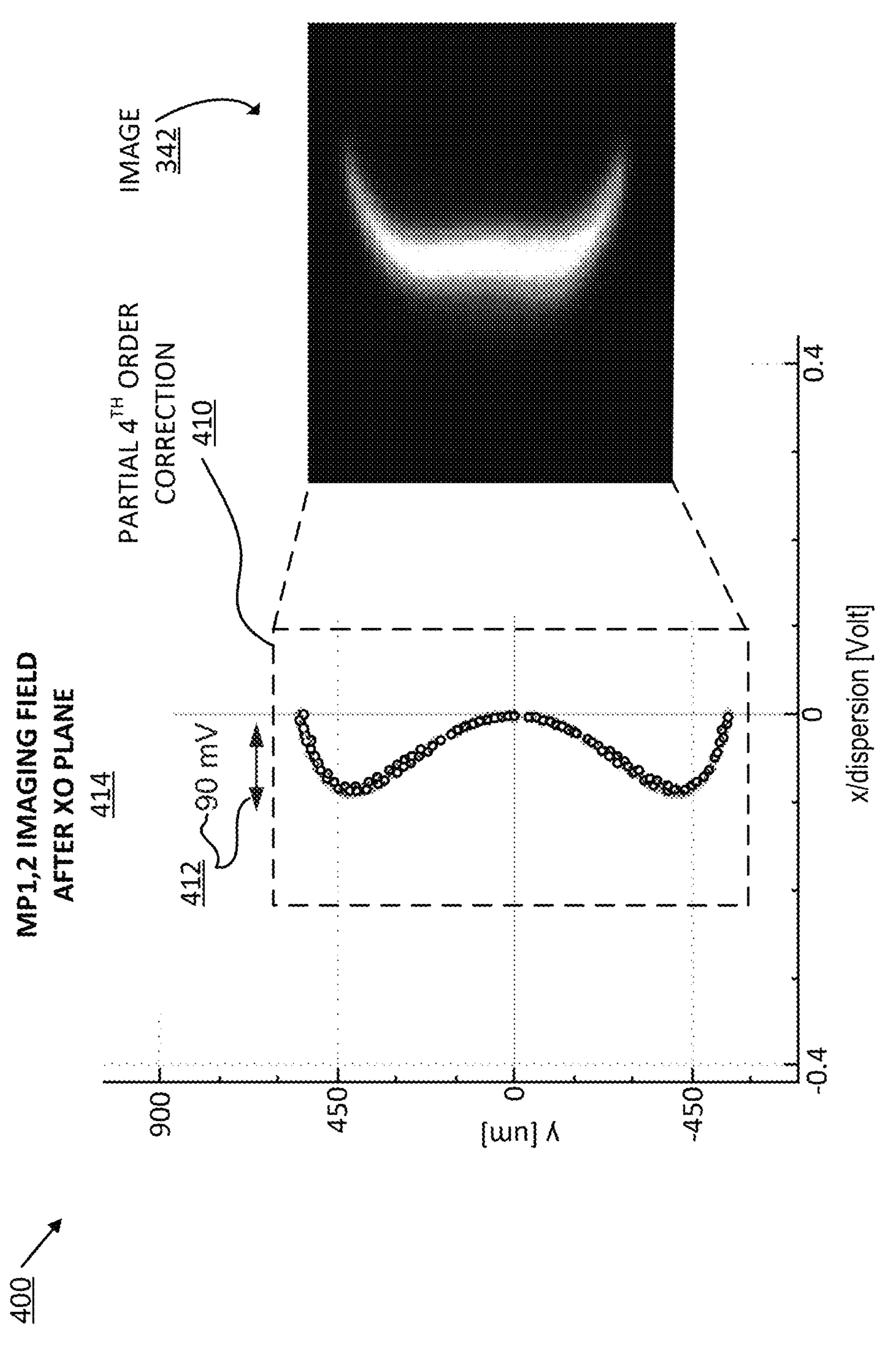
FIG. 4 is a spectrum image for a monochromatic beam, depicting a partial fourth order correction in a spectrometer, according to some embodiments.

FIG. 4 is a spectrum image 400 for a monochromatic beam after the XO plane 330 depicting a partial fourth order geometric aberration correction using the spectrometer 300 of FIG. 3, according to some embodiments. For example, the spectrum image 400 depicts an x-y plane 414 at the imaging plane 340 after MP1 350 and MP2 352 have performed at least one partial geometric aberration correction 410 (e.g., attenuating one or more orders of fourth order coefficients) and a chromatic aberration correction. A bottom axis may represent a dispersion voltage (e.g., from −0.4 to 0.4 volts) and the vertical axis shows a varying charged particle beam dispersion size (e.g., around one thousand micrometers "um") for y-field rays 306. In some examples, the partial geometric aberration correction may result in an image dispersion 412 which can increase or decrease depending on an operation of first optical correction element(s) 370. In the example depicted in FIG. 4, a ninety mV dispersion (resolution) is shown in image 342 with MP1 350 and MP2 352 applying respective decapole fields to the charged particle beam with no geometric aberration correction beyond XO plane 330.

Figure 5:
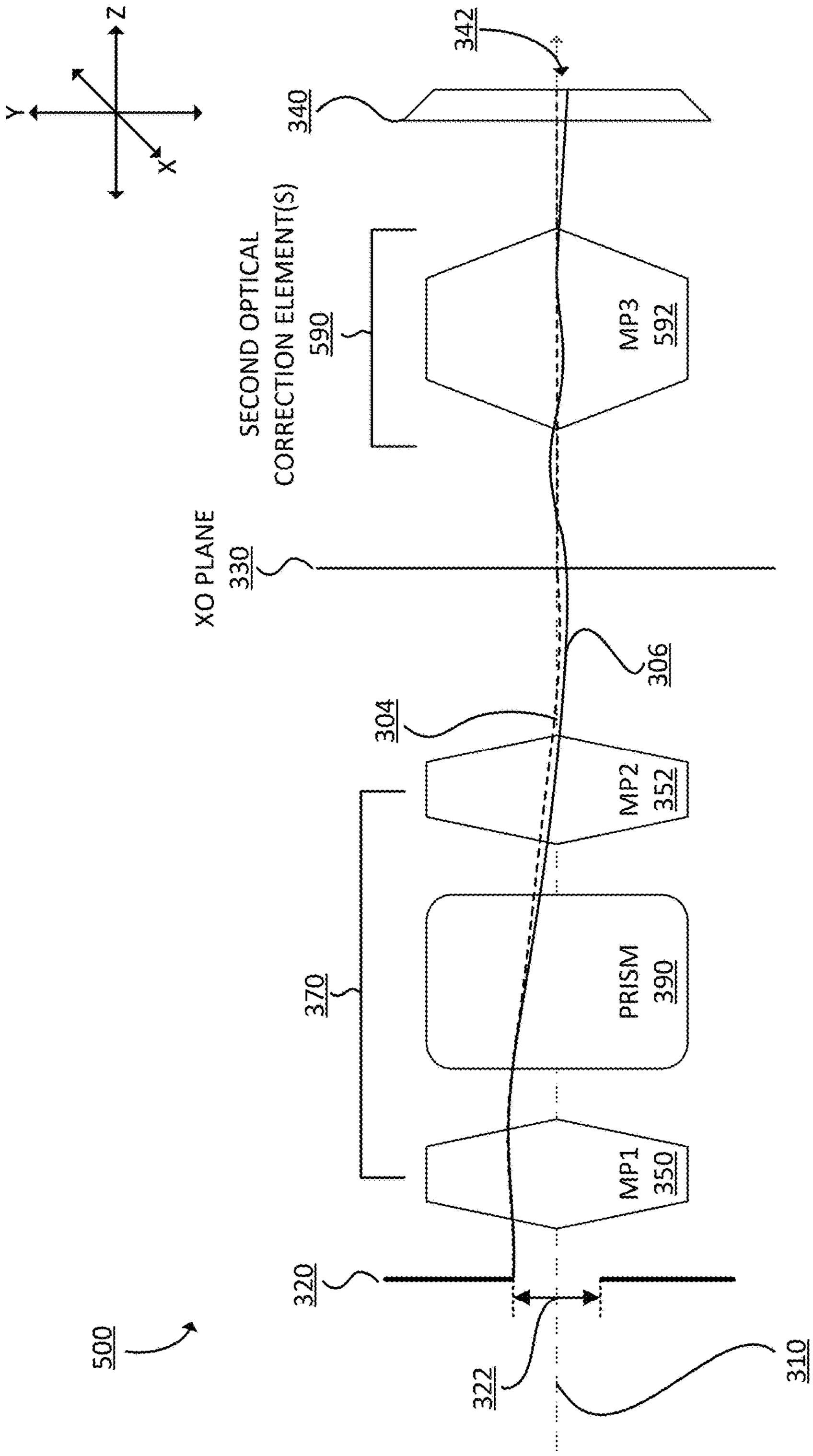
FIG. 5 is a schematic diagram depicting an example of geometric aberration correction with a post cross-over multipole element in a spectrometer, according to some embodiments.

FIG. 5 is a schematic diagram depicting an example of geometric and chromatic aberration correction in a spectrometer 500, according to some embodiments. The elements depicted in FIG. 5 may include some or all of the functionality of the elements depicted in FIG. 3. FIG. 5 depicts a charged particle beam entering first optical correction element(s) 370 from an entrance aperture 320 with an aperture diameter 322 of around 2.0 mm. The aperture diameter 322, along with prism 390, may influence a dispersion of the x-field ray 304 and the y-field ray 306. By way of example, the x-field ray 304 and the y-field ray 306 are depicted as being proximal to one another, relative to a z-axis, showing a small dispersion spread of the charged particle beam in an x-dimension and y-dimension (e.g., a generally round/circular beam waist). In addition, the aperture diameter 322 may function to increase or reduce an overall energy spread (e.g., charged particle flux) entering the spectrometer 500 which directly translates to an ability to obtain high resolution images. In some examples, a larger aperture diameter 322 provides more charged particles to the spectrometer 500 to undergo various aberration corrections. Similarly, a small aperture diameter 322 may limit the amount of charged particles entering the spectrometer 500, and thus limit the information entering the spectrometer about a sample being imaged. In some examples, a large aperture diameter 322 is preferable due to receiving more information about the sample by way of allowing more charged particles into the spectrometer. In other examples, a small aperture diameter 322 may be preferable due to material properties of the sample (e.g., contrast resolution).

In some examples, the spectrometer 500 includes first optical correction element(s) 370 which may include MP1 350 which may be a dodecapole element which applies a decapole field (e.g., pole induced electromagnetic field, each pole having one to twenty ampere-turns) to the charged particle beam to correct various aberrations including at least one second order aberration and at least one third order aberrations. Subsequently, the charged particle beam may enter a prism 390 (e.g., ninety degree prism) and, due to cylindrical field effects, may gain further aberrations to be corrected. Similar to MP1 351, MP2 352 may also be a dodecapole element which applies a decapole field to the charged particle beam. In this example, MP2 352 may receive the charged particle beam from the prism 390 and correct at least one second order aberration, at least one third order aberration, at least one fourth order aberration, as well as a chromatic aberration to correctly focus the charged particle beam. While a configuration of MP1-PRISM-MP2 is depicted in FIG. 5, it should be understood that any a number of multipoles may be used in conjunction with the prism 390 to achieve the desired corrections of aberrations of the charged particle beams. For example, MP1 350 may include two dodecapole elements, or in other examples, MP1 350 may include a dodecapole element and two hexapole elements serially in-line along the optical axis 310.

In some examples, second optical correction element(s) 590 may receive the charged particle beam from a final element in first optical correction element(s) 370 in order to perform further aberration corrections. By way of example, MP3 592 may be a dodecapole element which may further alter the charged particle beam to attenuate further orders of aberration. While a configuration of a single multipole MP3 592 is depicted in FIG. 5, it should be understood that any number of multipoles may be used in conjunction after the XO plane 330 to achieve the desired corrections of aberrations of the charged particle beams. For example, MP3 592 may include two or more dodecapole elements, or in other examples, MP3 592 may include a dodecapole element and two additional multipole elements serially in-line along the optical axis 310 as well as various dispersion magnification optics for suitable applications. In various examples related to EFTEM techniques, a slit (e.g., knife edge) may be positioned approximately in line with the XO plane 330 (e.g., slit plane) in order to measure pre-XO plane 330 aberrations and to nullify the pre-XO plane 330 aberrations by adjusting one or more of the first optical correction element(s) 370 (e.g., calibration of the charged particle beam).

Figure 6:
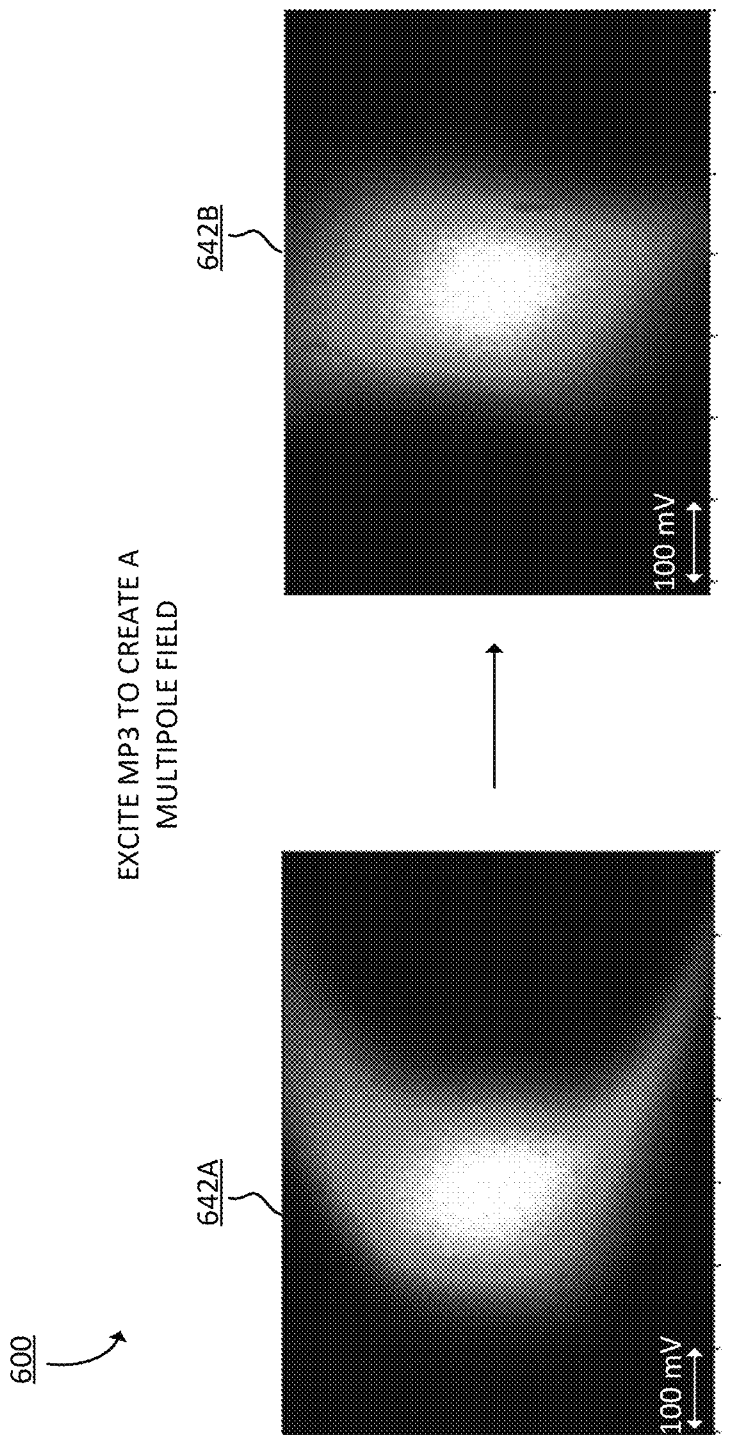
FIG. 6 is a set of images of various beam spectra of differing tunings of a post cross-over multipole element, according to some embodiments.

FIG. 6 is set of images 600 of various beam spectra of differing tunings of a post-Xoc plane 330 multipole element, according to some embodiments. The images 642A and 642B may be imaged spectra (e.g., image 342) using a monochromator (e.g., no chromatic aberrations present) without exciting MP3 592 (e.g., image 642A) and with exciting MP3 592 (e.g., image 642B) of FIG. 5. For example, image 642A may depict the charged particle beam undergoing partial geometric aberration corrections (e.g., attenuating at least one fourth order aberration coefficient) by first optical correction element(s) 370 pre-XO plane 330 without exciting MP3 592. This may result in one or more persisting geometric aberrations flaring as depicted in image 642A. Image 642B depicts the charged particle beam undergoing fourth order aberration correction (e.g., attenuating at least three fourth order aberration coefficients partially or in total), where MP1 350 and MP2 352 may function to remove some second, third, and fourth order geometric aberrations pre-XO plane 330 and MP3 592 (post-XO plane 330) may function to remove the remaining fourth order geometric aberrations which were not fully corrected by MP1 350 and MP2 352. As a result, image 642B depicts a substantially symmetrical and clear image 642B.

Figure 7:
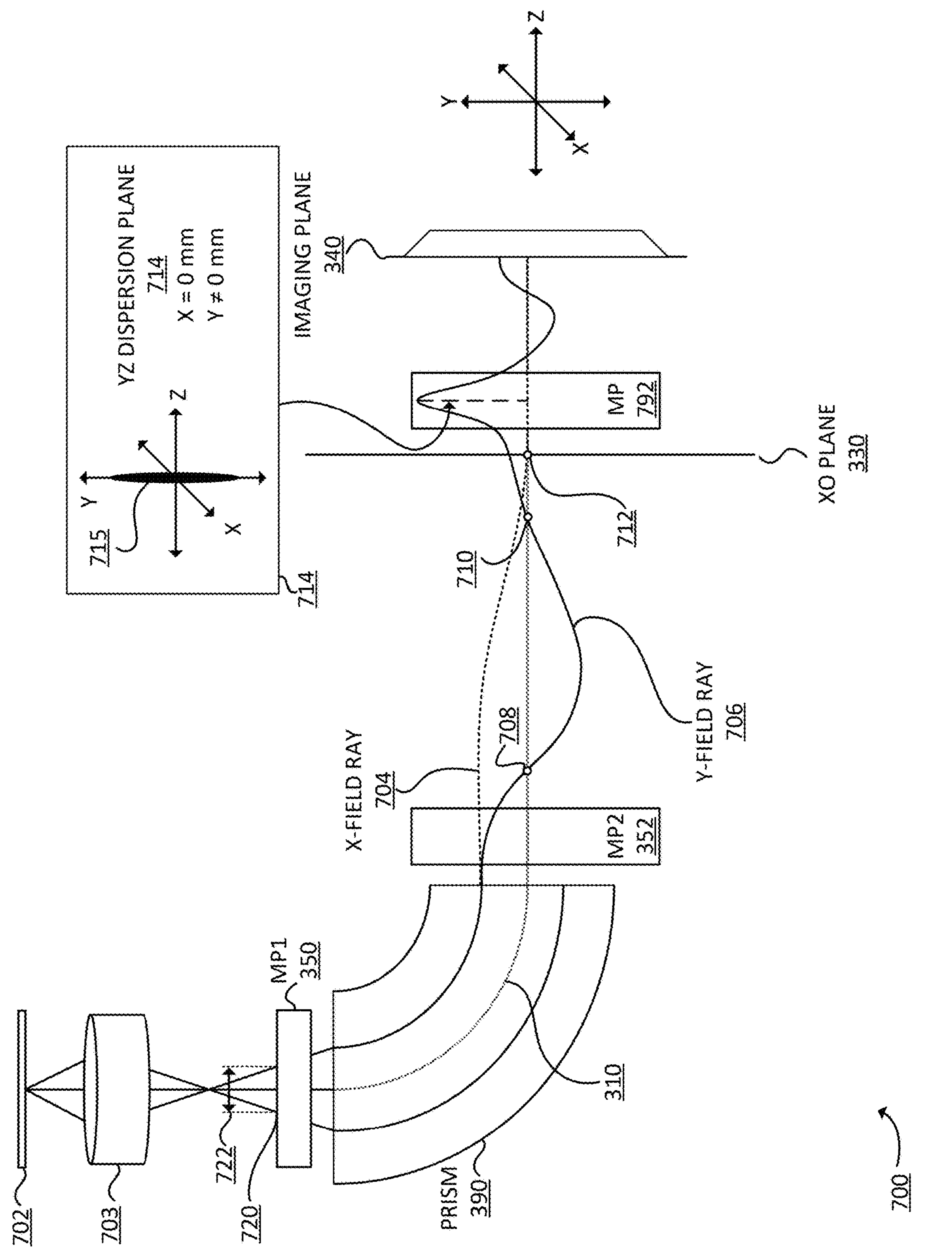
FIG. 7 is a schematic diagram depicting an example of a spectrometer with post cross-over aberration correction, according to some embodiments.

FIG. 7 is a schematic diagram depicting an example of a spectrometer 700 with post-XO plane 330 fourth order aberration correction, according to some embodiments. The spectrometer of FIG. 7 may use some or all components of spectrometer 300 of FIG. 3 or spectrometer 500 of FIG. 5. In some examples, the spectrometer 700 may receive a charged particle beam (e.g., electrons) along an optical axis 310 (z-axis) from one or more objective/projector optics 703 (e.g., beam guiding and shaping optics) which receive the charged particle beam from a sample 702. The spectrometer 700 may receive the charged particle beam through an entrance aperture 720 with an aperture diameter 722 proximate to MP1 352. In an example, the entrance aperture may have an entry hole with a diameter in a range of 0.1 mm to 10 mm. The aperture diameter 722 may, at least in part, affect a dispersion (e.g., spread of the beam in an x-axis direction vs spread of the beam in a y-axis direction along the z-axis) of axial fields rays such as an x-field ray 704 and a y-field ray 706 as the charged particle beam propagates through the spectrometer 700. The charged particle beam may be elongated (substantially elliptical) depending on the aperture diameter 722. It should be appreciated that the x, y, and z coordinates are depicted with the y coordinate representing a vertical displacement along the page, the x coordinate representing in and out of the page, and the z coordinate representing a left to right direction. For example, x-field ray 704 is depicted as traversing along the z-axis with a vertical measure, however, the vertical measure represents an out of page distance relative to the z-axis (if above the z-axis) and an in page distance relative to the z-axis (if below the z-axis). Additionally, each field ray may only represent a portion of the total field in the particular dimension. In addition, the spectrometer 700 may function in one or more modes such as parallel momentum resolved electron energy loss mode.

In some examples, an aperture diameter 722 of 5 mm may increase beam spread to the amount of charged particles reaching the spectrometer 700. For example, the larger aperture diameter 722 permits more charged particles to enter the spectrometer 700 thus enabling more information about a sample to be relayed to a detector (not depicted). The charged particle beam is relayed from the entrance aperture 720 into the first optical correction element(s) 370 (e.g., MP1 350, Prism 390, MP2 352, etc.) where the charged particle beam undergoes one or more operations to attenuate one or more fourth order aberration coefficients according to the equation $x=A_{40}\gamma^4+A_{22}\gamma^2\delta^2+A_{01}\delta^4$; where $A_{40}$, $A_{22}$, $A_{04}$ are fourth order aberration coefficients, with an angle $\gamma$ representing a dispersion angle of the beam parallel to an xz-plane, with $\delta$ representing a dispersion angle of the beam normal to an xz-plane (e.g., dispersion in a yz-plane). In addition, the first optical correction element(s) 370 and/or the second optical correction element(s) 590 may correct one or more mechanical aberrations (e.g., $A_{31}$ and $A_{13}$). For example, the first optical correction element(s) 370 may include a first multipole element MP1 350 (e.g., twelve pole, sixteen pole, etc.) that may alter one or more dimensions (e.g., x/y) of the charged particle beam. For a dodecapole element (twelve pole), twelve degrees of freedom are provided for altering the charged particle beam in a plane (perpendicular to the z-axis) axially along the optical axis 310. Similar to FIG. 5, the first optical correction element(s) 370 may include at least two multipoles MP1 350 and MP2 352. The first multipole element MP1 350 may produce a decapole field for partially correcting one or more of second order, third order, and fourth order aberrations by attenuating the aberration coefficients towards zero. The second multipole element MP2 352 may also generate a decapole field to further correct one or more of second order, third order, and fourth order aberrations that the prism 390 introduced into the charged particle beam. In addition, at least one of the pre-XO plane 330 multipole elements may correct a chromatic aberration of the charged particle beam. While only two multipole elements are discussed herein, it should be appreciated that any number of multipole elements (e.g., one to twenty) are contemplated with desired configurations (e.g., sixteen poles, twelve poles, eight poles, etc.) to achieve a desired beam shape. For example, an optimal configuration of elements may involve, from left to right along the z-axis, starting at the entrance aperture 720 may involve the following configuration: MP1 350, Prism 390, MP2 352, MPA to MPN, where N is the total number of multipole elements prior to the XO plane 330.

In some examples, a xz-line focus 708 may be formed in an xz-dispersion plane along the optical axis 310. A line focus may exist when one coordinate component (e.g., y-axis component) is in focus along the z-axis (e.g., y component of the field is approximately equal to zero mm relative to a point on the z-axis) and when a different coordinate component is not in focus with respect to the z-axis at that same point (e.g., x component of the field is not equal to zero mm at the point on the z-axis), thus forming a line focus of the charged particle beam. The xz-line focus 708 size is due, at least in part, to how large the aperture diameter 722 is (e.g., five mm). The xz-line focus 708 exists since, at that location, the y-field ray 706 is approximately zero mm relative to the z-axis which results in a yz-focus (not a line focus) in a yz-dispersion plane (an arbitrary plane parallel to the y-axis and z-axis but perpendicular to the x-axis), where the xz-line focus and yz-focus are at approximately the same location along the optical axis 310. The differences in xz-focuses and the yz-focuses may result in an oblong shaped fields (elongated in the x-axis or elongated in the y-axis depending on which of the x/y components are larger compared to the other) of the charged particle beam.

In various examples, the first optical correction element(s) 370 optics relays the conditioned charged particle beam across the XO plane 330. Within the XO-plane 330, the x-field ray 704 is approximately a point focus relative to the z-axis at a cross-over point (e.g., the axial x-field rays cross the z-axis at the same z coordinate). The charged particle beam may undergo further conditioning by second optical correction element(s) by way of increasing a beam dispersion along a yz-dispersion plane by intentionally not fully attenuating all fourth order aberration coefficients before the XO plane 330 and/or creating two foci prior to the XO plane 330. For example, MP1 350 and MP2 352 may function to correct two fourth order aberration coefficients such as $A_{40}$ and $A_{22}$ without attenuating the final coefficient $A_{04}$ of the fourth order aberration by magnifying a portion of the charged particle beam in a dispersive plane. In this example, as depicted, the y-field ray 706 may have two cross-over locations prior to the XO plane 330. The first location may be a first y cross-over point having at a first xz-line focus 708 and a second location may be a second y cross-over point having a second xz-line focus 710. By affecting the y-field ray 706 such that the second y cross-over point 710 located to the left of the XO plane 330 (whereas the y cross-over point 307 was on the right of the XO plane 330 as depicted in FIG. 3), the y-field ray 706 may be positioned to provide a sufficiently large (e.g., magnified) y field dispersion at MP 792. In an example, the y-field ray 706 may undergo dispersion magnification to widen the y-field ray 706 (elongate the beam profile in the xy plane such that the beam waist of the total beam is no longer circular). Widening the y-field ray 706 may be beneficial for conditioning, since a modestly low current (e.g., one to twenty ampere turns, more preferably one to five ampere turns) provided by a multipole element (e.g., MP 792) may be used to correct for higher order aberrations (e.g., aberrations of the shape Aoxx|8+)) more easily after the XO plane 330. Smaller widenings of the y-field ray 706 (caused by shifting the y cross-over point, e.g. the xz-line focus 710, closer to the XO plane 330) may necessitate larger currents by multipole elements to achieve the same results. A yz-line focus 712 (where the x-field ray 704 is approximately a point focus along z and remains substantially constant until the imaging plane 340) in a yz-dispersion plane exists in at least one point along the optical axis 310 which results in a widened y-dimension 714 (e.g., increased dispersion angle) of the y-field ray 706. At the yz-line focus 712 location, an xz-focus (approximately a point focus) along an xz-dispersion plane (an arbitrary plane parallel to both the x-axis and z-axis) exists such that a dispersion distance in an x-plane is approximately zero mm relative to the z-axis (e.g., optical axis 310). Beam profile 715 depicts an exaggerated three-dimensional representation of the yz-line focus 712 in the x-field ray 704 cross-over dispersion plane (yz-plane). For the sake of simplicity, the beam profile 715 depicted is exaggerated in an x-dimension (which is essentially zero mm) and would be essentially a line with "y height" on the z-axis at yz-line focus 712. Due to the larger aperture diameter 722 (e.g., five mm), enabling the yz-line focus 712 also spreads the energy of the spectrum across multiple points (along the y-axis) of the detector to reduce potential damage to the detector.

In some examples, one or more multipole elements (e.g., such as MP 792) may enable partial to full correction (e.g., attenuating between five percent and one hundred percent) of a fourth order aberration (e.g., aberration of shape $A_{04}$ $\langle x|\delta^4\rangle$ ). For example, the one or more multipole elements may generate a linear superposition of decapole fields, octupole fields, and hexapole fields (such as fields as in FIG. 8) to condition the charged particle beam further. Due to the widened y-dimension 714, e.g., yz-line focus 712, a relatively mild electromagnetic field (or ampere turns in the case of magnetic multipoles) may be applied to partially or fully correct the fourth order aberrations that the pre-XO plane 330 multipole elements intentionally did not fully correct. The charged particle beam may then be relayed to an imaging plane 340 where a detector may record an image at a specified resolution (e.g., by a user of the spectrometer).

In some examples, an energy resolution (e.g., resolution of the image at the detector) is the same at different aperture diameters 722 by using two foci prior to XO plane 330. For example, for an aperture diameter 722 of 2.5 mm may provide the same energy resolution for an aperture diameter 722 of 5 mm. The first energy resolution and second energy resolution may both be 0.01 mV/pixel for both aperture diameters 722 of 2.5 mm and 5 mm. That is to say that the transmissivity of the spectrometer 700 is improved such that the energy resolution at the detector may be, at least in part, decoupled from a size of the entrance aperture 720 for at least aperture diameters between 2.0 mm to 10 mm. In addition, signal-to-noise ratios may significantly improved in that the signal-to-noise ratio may be approximately equal for the aperture diameters between of 5 mm and 2.5 mm.

Figure 8:
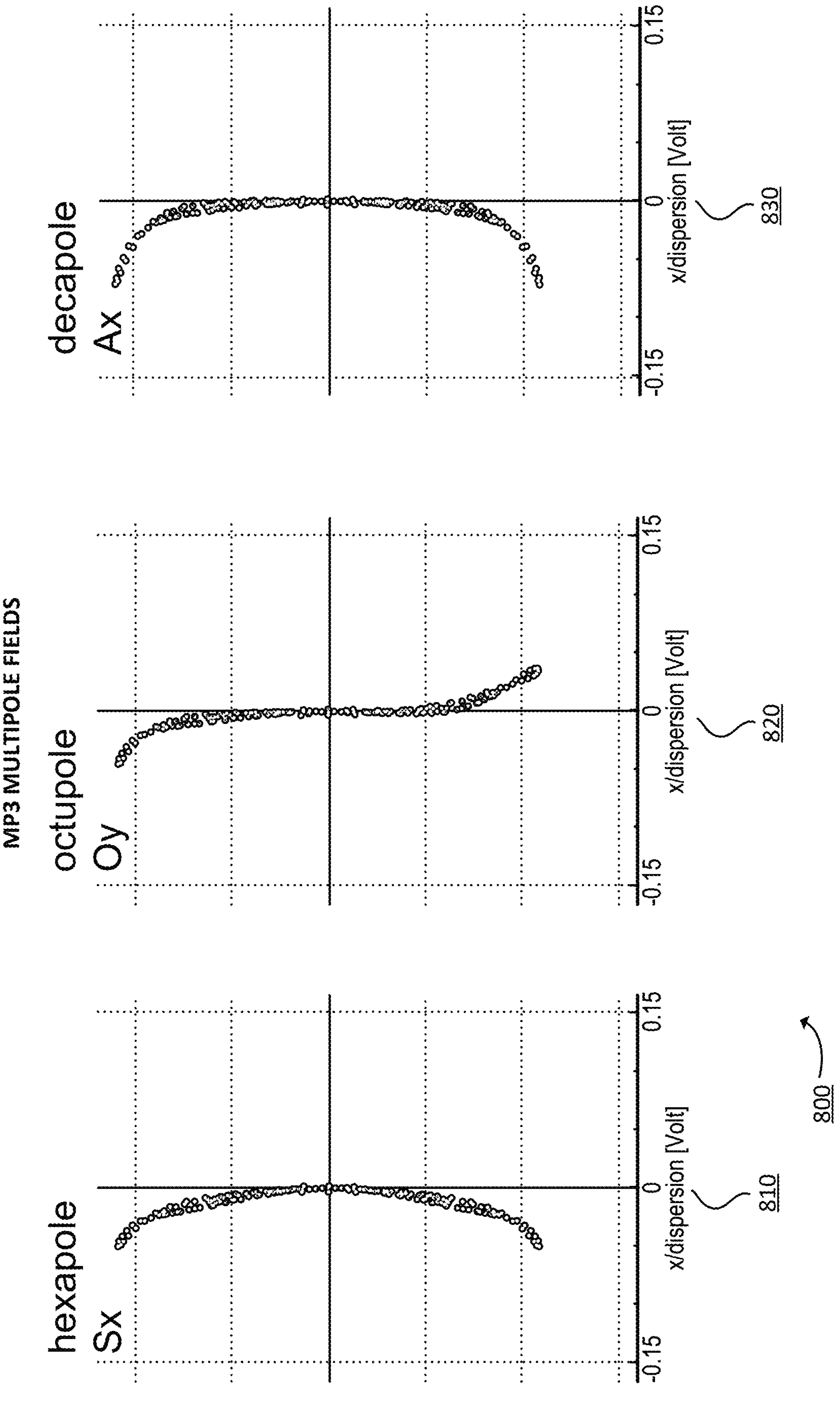
FIG. 8 is a set of images of various multipole fields generated by a post cross-over multipole element, according to some embodiments.

FIG. 8 is a set of images 800 of various multipole fields generated by a post-XO plane 330 multipole element, according to some embodiments. The set of images 800 of FIG. 8 represent may be generated by one or more pre-XO plane 330 or post-XO plane 330 multipole elements of the spectrometer of FIG. 7. In some examples, depending on a shape of the beam profile after the XO plane 330, various multipole fields may be needed to attenuate fourth order aberrations. The post-XO plane 330 multipole element may apply any of the multipole fields 810 (hexapole), 820 (octupole), 830 (decapole) as a linear superposition, or alone, to attenuate the fourth order aberrations. In addition, it is contemplated that any suitable multipole field may be applied to achieve a desired beam profile. While the multipole fields are depicted relative to an x-axis dispersion, it should be appreciated that the axis may be interchanged depending on a desired dispersion direction of the beam post-XO plane 330.

Figure 9:
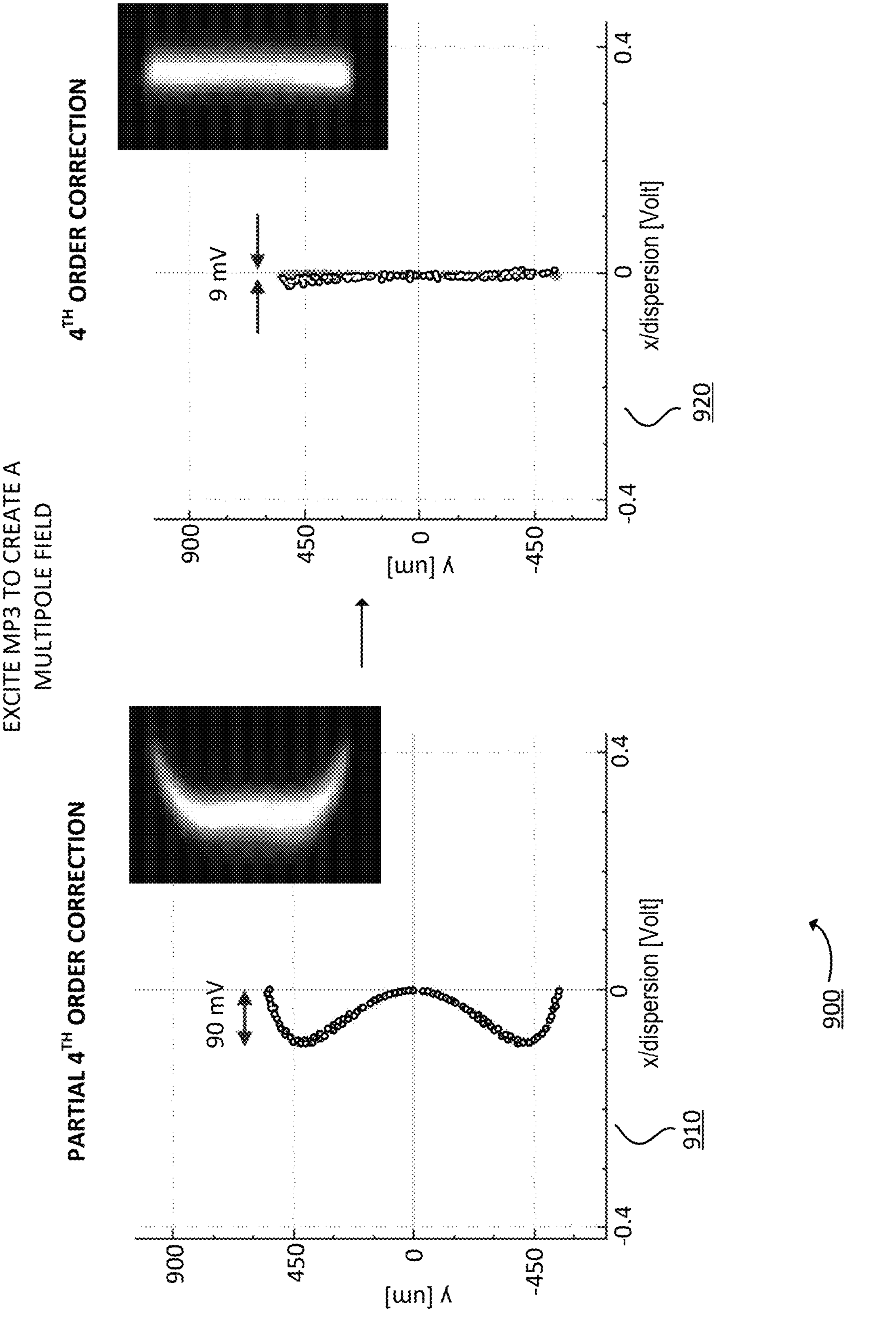
FIG. 9 is a set of imaging fields generated by a post beam cross-over multipole element in a spectrometer, according to some embodiments.

FIG. 9 is a set of imaging fields 900 generated by a post-XO plane 330 multipole element in a spectrometer, according to some embodiments. The set of imaging fields 900 of FIG. 9 may be detected by one or more post-XO plane 330 detector of the spectrometer of FIG. 7. For example, the imaging field 900 depicts an x-y plane at the imaging plane 340 after MP1 350 and MP2 352 have performed at least one partial geometric aberration correction 910 (e.g., attenuating one or more orders of fourth order coefficients) and a chromatic aberration correction. A bottom axis may represent a dispersion voltage (e.g., from −0.4 to 0.4 volts) and the vertical axis shows a varying charged particle beam dispersion size (e.g., around 1000 um) for y-field rays. In some examples, the partial geometric aberration correction 910 may result in an energy dispersion (ninety mV) which can increase or decrease depending on an arrangement of the correction optics. In the example depicted in FIG. 9, a ninety mV dispersion (resolution) is shown in with MP1 350 and MP2 352 applying respective decapole fields to the charged particle beam. Depicted on the right, a fourth order geometric aberration correction 920 is performed, post-XO plane 330, by applying one or more of the multipole fields (810, 820, 830) as in FIG. 8 to the charged particle beam. As a result, a full order of magnitude difference in energy resolution (e.g., nine mV-right and ninety mV-left) may be achieved by applying a multipole field to the charged particle beam post-XO plane 330.

Figure 10:
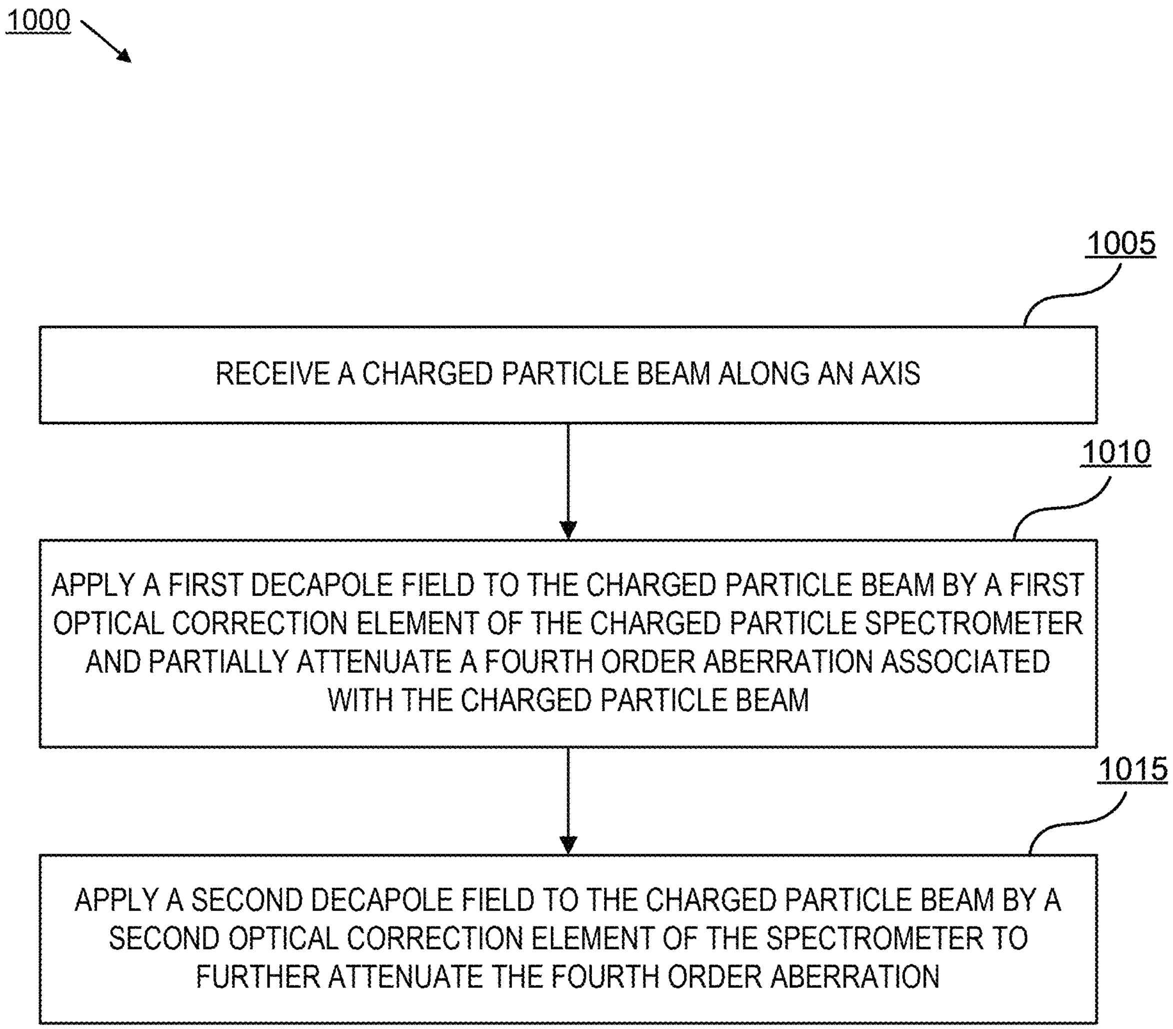
FIG. 10 is a flow diagram of an example process for correcting aberrations in a spectrometer, according to some embodiments.

FIG. 10 is a flow diagram of an example process for correcting fourth order aberrations in a spectrometer, according to some embodiments. At block 1005, a spectrometer (such as spectrometer 700), receives a charged particle beam along an axis (optical axis) from a TEM. The process may be implemented in high resolution electron energy loss spectroscopy (HR-EELS), electron energy loss spectroscopy (EELS), momentum resolved electron energy loss spectroscopy (q-EELS), plasmon spectroscopy, phonon spectroscopy, energy filtered spectroscopy (EFTEM), or similar. The charged particle beam may include information (e.g., energy loss or similar) related to a sample imaged in the TEM.

At block 1010, a first optical correction element may apply a first decapole field to the charged particle beam. For example, the first optical correction element may include a first multipole element (e.g., such as a dodecapole element), a ninety-degree prism for changing an axis of the charged particle beam placed subsequent the first multipole element, and a second multipole element (e.g., such as a dodecapole element). In this example, the first multipole element may apply a decapole field to the charged particle beam prior to entering the prism. The first decapole field may function to partially attenuate one or more orders of geometric aberrations associated with the charged particle beam. The second multipole element may function to further attenuate one or more orders of geometric aberrations (e.g., partially attenuating one or more orders of geometric aberrations) as well as a chromatic aberration associated with the charged particle beam prior to a cross-over on the axis.

At block 1015, a line focus (xz-line focus) may be formed after the second multipole element and prior to a cross-over. In addition, a yz-focus may occur coplanar with the xz-line focus in a dispersion plane along the axis (optical axis). The enhanced dispersion may be due, at least in part, on an increased entrance aperture diameter (e.g., five mm). The yz-focus may be left, at least in part, unconditioned in order to attenuate a fourth order aberration after the cross-over.

At block 1015, a second optical correction element may apply a multipole field (decapole field) to the charged particle beam after the cross-over. For example, the second optical correction element may include a third multipole element (e.g., dodecapole element) that applies a decapole field to further attenuate a fourth order aberration (e.g., attenuate at least three fourth order aberration coefficients). By combination of the first, second, and third multipole elements applying decapole fields both pre-cross-over and post cross-over, the spectrometer may attenuate fourth order aberrations without compromising an energy resolution of an image.

Figure 11:
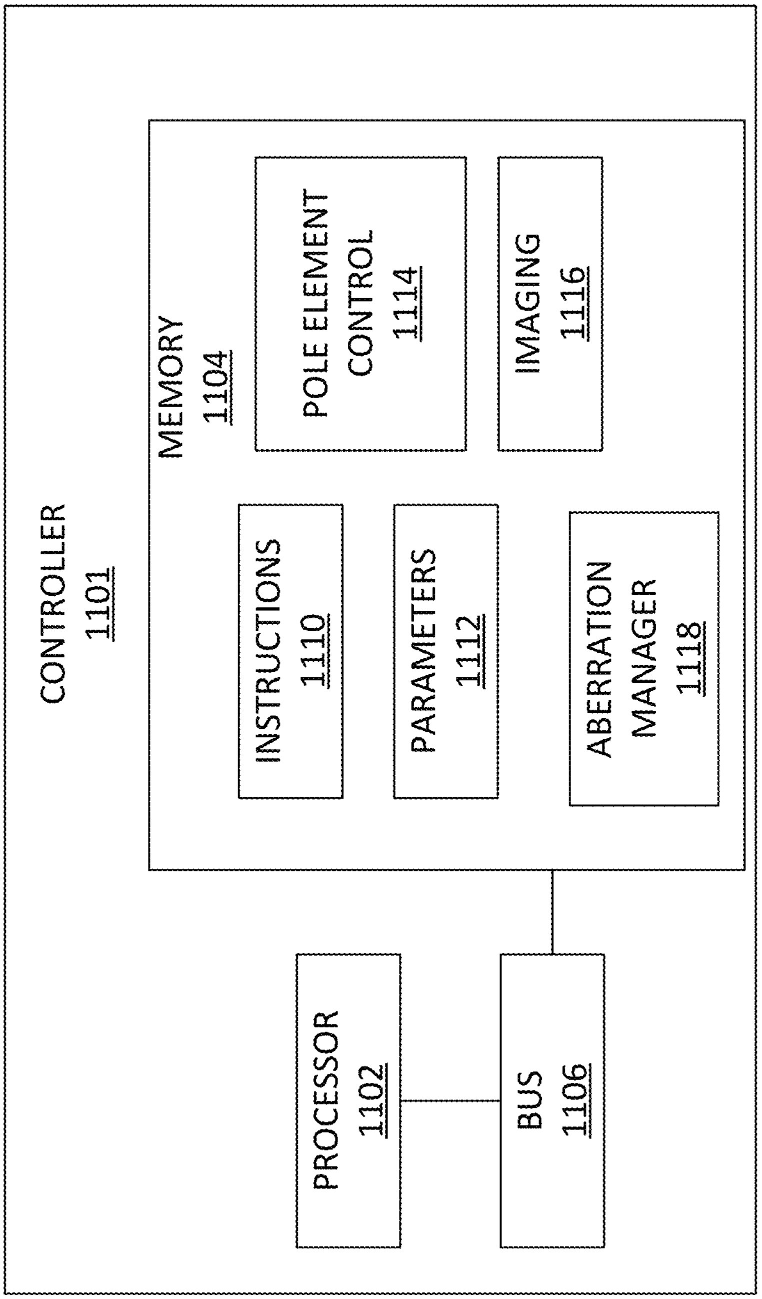
FIG. 11 is a block diagram of a controller for a charged particle microscope system according to certain aspects of the present disclosure.

FIG. 11 is a block diagram of a controller 1101 for an electron microscope system according to certain aspects of the present disclosure. Examples of the electron microscope system can include microscope system 100 from FIG. 1. As shown, the controller 1101 includes a processor 1102 communicatively coupled to memory 1104. The processor 1102 can include one processing device or multiple processing devices. Non-limiting examples of the processor 1102 include a Field-Programmable Gate Array (FPGA), an application specific integrated circuit (ASIC), a microprocessor, or any combination of these. The processor 1102 can execute instructions 1110 stored in the memory 1104 to perform operations, such as the operations of process 1000 from FIG. 10. In some examples, the instructions 1110 can include processor-specific instructions generated by a compiler or an interpreter from code written in any suitable computer-programming language, such as C, C++, C#, Python, or Java.

The memory 1104 can include one memory device or multiple memory devices. The memory 1104 can be non-volatile and may include any type of memory device that retains stored information when powered off. Non-limiting examples of the memory 1104 include electrically crasable and programmable read-only memory (EEPROM), flash memory, or any other type of non-volatile memory. At least some of the memory 1004 can include a non-transitory computer-readable medium from which the processor 1102 can read instructions 1110 via bus 1106. The bus 1106 may be a communication and/or power bus that enables processor 1102 to communicate with memory 1004. The non-transitory computer-readable medium can include electronic, optical, magnetic, or other storage devices capable of providing the processor 1102 with the instructions 1110 or other program code. Non-limiting examples of the non-transitory computer-readable medium include magnetic disk(s), memory chip(s), RAM, an ASIC, or any other medium from which a computer processor can read instructions 1110.

The memory 1104 can further include information about parameters 1112 (e.g., calibration, slit positioning, tuning, etc.), pole element control 1114 (e.g., specific voltages applied to multipole elements), imaging 1116 (e.g., detector control, image analysis, etc.), and an aberration manager 1118 (e.g., controlling combinations of multipole elements to work in unison). The controller 1101 can receive the information about operating parameters from a microscope, such as a TEM. At least some of the information about parameters 1112 can be pre-stored and can be associated with a chromatic defocus correction for a defocus caused by the change in magnification. The parameters 1112 can include operating parameters associated with an electron microscope system, such as a desired energy/primary energy of an electron beam, an energy spread of an energy loss spectrum, calibration using a knife-edge slit etc. The controller can determine or calculate the amount of defocus based on the parameters 1112 and the pole element controls 1114. In some examples, some of the parameters 1112 can be compared to the predetermined thresholds (e.g., known multipole arrangements, known field strengths, etc.). The comparison may determine how high a field strength each multipole element applies based on instructions from the aberration manager 1118. The aberration manager 1118 can be used to adjust operations of one or more optical components in an energy spectrometer.

In the preceding description, various embodiments have been described. For purposes of explanation, specific configurations and details have been set forth in order to provide a thorough understanding of the embodiments. However, it will also be apparent to one skilled in the art that the embodiments may be practiced without the specific details. Furthermore, well-known features may have been omitted or simplified in order not to obscure the embodiment being described. While example embodiments described herein center on electron microscopy systems, and TEM/EELS systems in particular, these are meant as non-limiting, illustrative embodiments. Embodiments of the present disclosure are not limited to such materials, but rather are intended to address electron beam systems for which a wide array of particles can be applied to imaging, microanalysis, and/or processing of materials on an atomic scale. Such particles may include, but are not limited to, electrons, ions, or photons in TEM systems, SEM systems, STEM systems, ion beam systems, and/or particle accelerator systems.

Some embodiments of the present disclosure include a system including one or more data processors and/or logic circuits. In some embodiments, the system includes a non-transitory computer readable storage medium containing instructions which, when executed on the one or more data processors, cause the one or more data processors to perform part or all of one or more methods and/or part or all of one or more processes and workflows disclosed herein. Some embodiments of the present disclosure include a computer-program product tangibly embodied in a non-transitory machine-readable storage medium, including instructions configured to cause one or more data processors to perform part or all of one or more methods and/or part or all of one or more processes disclosed herein, including, for example, process 1000 of FIG. 10.

The terms and expressions which have been employed are used as terms of description and not of limitation, and there is no intention in the use of such terms and expressions of excluding any equivalents of the features shown and described or portions thereof, but it is recognized that various modifications are possible within the scope of the claims. Thus, it should be understood that although the present disclosure includes specific embodiments and optional features, modification and variation of the concepts herein disclosed may be resorted to by those skilled in the art, and that such modifications and variations are considered to be within the scope of the appended claims.

Where terms are used without explicit definition, it is understood that the ordinary meaning of the word is intended, unless a term carries a special and/or specific meaning in the field of charged particle microscopy systems or other relevant fields. The terms "approximately", "same", "about", "similar", or "substantially" are used to indicate a deviation from the stated property or numerical value within which the deviation has little to no influence of the corresponding function, property, or attribute of the structure being described. In an illustrated example, where a dimensional parameter is described as "substantially equal" or "approximate" to another dimensional parameter, the term "substantially" or "approximate" is intended to reflect that the two dimensions being compared can be unequal within a tolerable limit, such as a fabrication tolerance. Similarly, where a geometric parameter, such as an alignment or angular orientation, is described as "about" normal, "substantially" normal, or "substantially" parallel, "approximately" equal, "approximately" the same, the terms "about" or "substantially" or "approximately" are intended to reflect that the alignment or angular orientation can be different from the exact stated condition (e.g., not exactly normal) within a tolerable limit. For dimensional values, such as diameters, lengths, widths, or the like, the term "about" can be understood to describe a deviation from the stated value of up to +10%. For example, a dimension of "about ten mm" can describe a dimension from nine mm to eleven mm. In the present disclosure, "sub-ranges" refers to a range of values between the two stated extents and/or including one of the two stated extents.

The description provides exemplary embodiments, and is not intended to limit the scope, applicability or configuration of the disclosure. Rather, the ensuing description of the exemplary embodiments will provide those skilled in the art with an enabling description for implementing various embodiments. It is understood that various changes may be made in the function and arrangement of elements without departing from the spirit and scope as set forth in the appended claims.

Specific details are given in the description to provide a thorough understanding of the embodiments. However, it will be understood that the embodiments may be practiced without these specific details. For example, specific system components, systems, processes, and other elements of the present disclosure may be shown in schematic diagram form or omitted from illustrations in order not to obscure the embodiments in unnecessary detail. In other instances, well-known circuits, processes, components, structures, and/or techniques may be shown without unnecessary detail.

What is claimed is:

1. A method for simultaneously magnifying a dispersive plane and correcting aberrations in a charged particle spectrometer, the method comprising:

receiving, by the charged particle spectrometer, a charged particle beam along an axis;

applying a first decapole field to the charged particle beam by a first optical correction element of the charged particle spectrometer, wherein the first optical correction element is positioned before a cross-over on the axis, and wherein the first decapole field partially attenuates a fourth order aberration associated with the charged particle beam; and applying a second decapole field to the charged particle beam by a second optical correction element of the charged particle spectrometer, wherein the second optical correction element has a position after the cross-over, wherein a dispersion plane of the charged particle beam exists after the cross-over such that a dispersion of the charged particle beam exists at the position of the second optical correction element, wherein the second decapole field further attenuates the fourth order aberration.

2. The method of claim 1, wherein receiving the charged particle beam along the axis further comprises:

receiving the charged particle beam through an entrance aperture positioned prior to the first optical correction element, wherein an aperture diameter of the entrance aperture is in a first range of 0.1 mm to 10 mm, and wherein a line focus of the charged particle beam comprises at least one of: (i) an xz-line focus along an xz-dispersion plane at a focus location before the cross-over, or (ii) a yz-line focus in a yz-dispersion plane along the axis at a second focus location after the cross-over.

3. The method of claim 2, further comprising:

measuring the charged particle beam at a detector positioned after the second optical correction element to produce an image, wherein a resolution of the image is in a range of 0.01 mV/pixel to 1000 mV/pixel.

4. The method of claim 1, wherein partially attenuating the fourth order aberration by the first optical correction element comprises attenuating at least two fourth order aberration coefficients, wherein further attenuating the fourth order aberration further by the second optical correction element comprises attenuating at least one additional fourth order aberration coefficient, wherein the at least two fourth order aberration coefficients and the at least one additional fourth order aberration coefficient are each different coefficients of the fourth order aberration.

5. The method of claim 1, wherein each one of the first optical correction element and the second optical correction element comprises one or more corresponding dodecapole elements.

6. The method of claim 1, wherein the second decapole field is applied by using a first range of ampere-turns, wherein the first range of ampere-turns is 1 to 20 ampere-turns.

7. The method of claim 4, wherein the at least two fourth order aberration coefficients are $A_{22}$, $A_{40}$ and the at least one additional fourth order aberration coefficient is $A_{04}$.

8. The method of claim 1, wherein partially attenuating the fourth order aberration further by the first optical correction element comprises partially attenuating a geometric aberration associated with the charged particle beam, and wherein further attenuating the fourth order aberration by the second optical correction element comprises attenuating a geometric aberration of shape $A_{0n}\langle x|\delta^n\rangle$, wherein $A_{0n}$ is an aberration coefficient, wherein x is an imaging axis, wherein n is a unique order of aberration, and wherein $\delta$ is a dispersion angle associated with the charged particle beam relative to the dispersion plane.

9. The method of claim 1, wherein the first optical correction element comprises: a first multipole element and a second multipole element, wherein applying the first decapole field to the charged particle beam comprises exciting the first multipole element and the second multipole element, and wherein up to four orders of geometric aberrations and attenuating one or more orders of chromatic aberration are partially attenuated in response to exciting the first multipole element and the second multipole element.

10. The method of claim 1, wherein the second optical correction element comprises: a third multipole element, wherein applying the second decapole field to the charged particle beam further comprises exciting the third multipole element, and wherein up to four orders of geometric aberrations are attenuated in response to exciting the third multipole element.

11. A non-transitory computer-readable storage medium comprising instructions that are executable by one or more processors of a charged particle spectrometer for causing operations comprising:

applying a first decapole field to a charged particle beam by a first optical correction element of the charged particle spectrometer, the charged particle beam received by the charged particle spectrometer along an axis, wherein the first optical correction element is positioned before a cross-over on the axis, and wherein the first decapole field partially attenuates a fourth order aberration associated with the charged particle beam; and applying a second decapole field to the charged particle beam by a second optical correction element of the charged particle spectrometer, wherein the second optical correction element is positioned after the cross-over, wherein a dispersion plane of the charged particle beam exists after the cross-over such that a dispersion of the charged particle beam exists in the dispersion plane at a position of the second optical correction element, wherein the second decapole field further attenuates the fourth order aberration.

12. The non-transitory computer-readable storage medium of claim 11, wherein the operations further comprise:

applying one or both of a hexapole field and an octupole field to the charged particle beam.

13. The non-transitory computer-readable storage medium of claim 11, wherein performing the operations further comprises:

increasing a first dispersion along a yz-dispersion plane of the charged particle beam after the cross-over relative to the axis while maintaining a second dispersion along an xz-dispersion plane of the charged particle beam at a constant size relative to the axis.

14. The non-transitory computer-readable storage medium of claim 11, wherein the charged particle spectrometer may include a parallel momentum resolved electron energy loss mode, and wherein attenuation of the fourth order aberration causes a reduction to a distortion of an image along the axis by an order of magnitude.

15. A charged particle spectrometer, the charged particle spectrometer comprising:

a first optical correction element;

a second optical correction element;

an entrance aperture configured to receive a charged particle beam; and a controller configured to:

cause the first optical correction element to apply a first decapole field to the charged particle beam, wherein the first optical correction element is positioned before a cross-over on an axis, and wherein the first decapole field partially attenuates a fourth order aberration associated with the charged particle beam; and cause the second optical correction element to apply a second decapole field to the charged particle beam, wherein the second optical correction element has a position after the cross-over such that a dispersion of the charged particle beam exists in a dispersion plane at the position of the second optical correction element, wherein the second decapole field further attenuates the fourth order aberration.

16. The charged particle spectrometer of claim 15, wherein the charged particle spectrometer comprises:

wherein the entrance aperture has an aperture diameter, wherein aperture diameters in a range of 2 mm to 5 mm produce equal energy resolutions.

17. The charged particle spectrometer of claim 15, wherein the charged particle spectrometer comprises:

wherein the entrance aperture has an aperture diameter, wherein aperture diameters in a range of 2 mm to 5 mm produce equal a signal-to-noise ratios.

18. The charged particle spectrometer of claim 15, wherein the charged particle spectrometer includes a slit or a knife-edge, wherein the first optical correction element is positioned before the slit or knife-edge, and wherein the second optical correction element is positioned after the slit or the knife-edge.

19. The charged particle spectrometer of claim 15, wherein the controller is further configured to:

cause the first optical correction element to apply a third decapole field to the charged particle beam, wherein applying the third decapole field to the charged particle beam at least partially modifies a y-field dimension of the charged particle beam to have at least two foci prior to the cross-over such that a dispersion of the charged particle beam in the dispersion plane is magnified.

20. The charged particle spectrometer of claim 15, wherein two fourth order coefficients are attenuated prior to the cross-over on the axis and one fourth order coefficient is attenuated after the cross-over on the axis.

* * * * *